(12) United States Patent
Kasai

(10) Patent No.: US 8,805,289 B2
(45) Date of Patent: Aug. 12, 2014

(54) STANDING WAVE RATIO MEASURING CIRCUIT AND COMMUNICATION APPARATUS

(75) Inventor: Masahiro Kasai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 932 days.

(21) Appl. No.: 12/952,757

(22) Filed: Nov. 23, 2010

(65) Prior Publication Data

US 2011/0124293 A1    May 26, 2011

(30) Foreign Application Priority Data

Nov. 24, 2009    (JP) ................................. 2009-266846

(51) Int. Cl.
*H04B 17/00*     (2006.01)
(52) U.S. Cl.
USPC ............. 455/67.11; 455/83; 455/84; 324/123
(58) Field of Classification Search
USPC ............................ 455/67.11, 83, 84; 324/123
See application file for complete search history.

(56) References Cited

U.S. PATENT DOCUMENTS

| 7,373,115 B2 * | 5/2008 | Monroe | 455/82 |
| 2010/0148745 A1 * | 6/2010 | Kanou | 323/318 |
| 2010/0159851 A1 | 6/2010 | Endo et al. | |

FOREIGN PATENT DOCUMENTS

| EP | 2073393 A2 | 6/2009 |
| JP | 2004-286632 A | 10/2004 |
| JP | 2008-147934 A | 6/2008 |
| WO | WO 2009/016762 A1 | 2/2009 |

OTHER PUBLICATIONS

Extended European Search Report, issued Mar. 25, 2011 for corresponding European Application No. 10192061.9.

* cited by examiner

*Primary Examiner* — Hsin-Chun Liao
(74) *Attorney, Agent, or Firm* — Fujitsu Patent Center

(57) ABSTRACT

A standing wave ratio measuring circuit includes an amplifier circuit amplifying a transmission signal; a first circulator outputting the transmission signal amplified in a direction of an antenna, and outputting a reception signal received by the antenna to a reception system; a traveling wave bypassing unit allowing the transmission signal (the traveling wave), before being input to the amplifier circuit, to travel to the reception system while bypassing the amplifier circuit when a request to measure a standing wave ratio is detected; a second circulator outputting the traveling wave bypassing the amplifier circuit in a direction of the first circulator; a control unit controlling the amplifier circuit; a reflected wave acquiring unit acquiring a reflected wave at a location after the second circulator in the reception system; and a measuring circuit measuring the standing wave ratio using the traveling wave and the reflected wave.

14 Claims, 16 Drawing Sheets

FIG. 4

| NO. | OPERATION MODE (INTERVAL) | TIMING CHART | CONTENT OF CONTROL FOR VARIOUS UNITS (ON/OFF) | | | |
|---|---|---|---|---|---|---|
| | | | TRANSMISSION SIGNAL | SW1 OPERATION | PA OPERATION | SWR COMPUTING PROCESS |
| (1) | TRANSMISSION MODE | TRANSMISSION WAVE | OUTPUT ON | CONNECTED TO PA SIDE | ON | OFF (DISABLED) |
| (2) | RECEPTION MODE | RECEPTION WAVE | OUTPUT OFF | CONNECTED TO CIR2 SIDE | OFF | OFF (DISABLED) |
| (3) | SWR MEASUREMENT MODE | TRAVELING WAVE (REFLECTED WAVE) | OUTPUT ON | CONNECTED TO CIR2 SIDE | OFF | ON (ENABLED) |

(columns labeled 2a, 2b, 2c)

FIG. 5

| NO. | OPERATION MODE (INTERVAL) | TIMING CHART | CONTENT OF CONTROL FOR VARIOUS UNITS (ON/OFF) | | | |
|---|---|---|---|---|---|---|
| | | | TRANSMISSION SIGNAL | SW1 OPERATION (3a) | PA OPERATION (3b) | SWR COMPUTING PROCESS (3c) |
| (1) | TRANSMISSION MODE | TRANSMISSION WAVE | OUTPUT ON | CONNECTED TO PA SIDE | ON | OFF (DISABLED) |
| (2) | RECEPTION MODE | RECEPTION WAVE | OUTPUT OFF | CONNECTED TO CIR2 SIDE | OFF | OFF (DISABLED) |
| (3) | SWR MEASUREMENT MODE | TRAVELING WAVE (REFLECTED WAVE) | OUTPUT ON | CONNECTED TO CIR2 SIDE | OFF | ON (ENABLED) |

FIG. 8

| NO. | OPERATION MODE (INTERVAL) | TIMING CHART | CONTENT OF CONTROL FOR VARIOUS UNITS (ON/OFF) | | | | |
|---|---|---|---|---|---|---|---|
| | | | TRANSMISSION SIGNAL | SW2 OPERATION | PA OPERATION | SWR COMPUTING PROCESS | SW3 OPERATION |
| (1) | TRANSMISSION MODE | TRANSMISSION WAVE | OUTPUT ON | CONNECTED TO PA SIDE | ON | OFF (DISABLED) | CONNECTED TO TERMINATOR (5a) |
| (2) | RECEPTION MODE | RECEPTION WAVE | OUTPUT OFF | CONNECTED TO CIR2 SIDE | OFF | OFF (DISABLED) | CONNECTED TO TERMINATOR (5b) |
| (3) | SWR MEASUREMENT MODE | TRAVELING WAVE (REFLECTED WAVE) | OUTPUT ON | CONNECTED TO CIR2 SIDE | OFF | ON (ENABLED) | CONNECTED TO SW2 SIDE (5c) |

FIG. 10

| NO. | OPERATION MODE (INTERVAL) | TIMING CHART | CONTENT OF CONTROL FOR VARIOUS UNITS (ON/OFF) | | | | |
|---|---|---|---|---|---|---|---|
| | | | TRANSMISSION SIGNAL | SW1 OPERATION | PA OPERATION | SWR COMPUTING PROCESS | SW4 OPERATION |
| (1) | TRANSMISSION MODE | TRANSMISSION WAVE | OUTPUT ON | CONNECTED TO PA SIDE | ON | OFF (DISABLED) | CONNECTED TO SWR COMPUTING CIRCUIT SIDE — 6a |
| (2) | RECEPTION MODE | RECEPTION WAVE | OUTPUT OFF | CONNECTED TO CIR2 SIDE | OFF | OFF (DISABLED) | CONNECTED TO LNA SIDE — 6b |
| (3) | SWR MEASUREMENT MODE | TRAVELING WAVE (REFLECTED WAVE) | OUTPUT ON | CONNECTED TO CIR2 SIDE | OFF | ON (ENABLED) | CONNECTED TO SWR COMPUTING CIRCUIT SIDE — 6c |

FIG. 13

| NO. | OPERATION MODE (INTERVAL) | CONTENT OF CONTROL FOR VARIOUS UNITS (ON/OFF) | | | | | |
|---|---|---|---|---|---|---|---|
| | | TIMING CHART | TRANSMISSION SIGNAL | SW1 OPERATION | PA OPERATION | SWR COMPUTING PROCESS | SW5 OPERATION |
| (1) | TRANSMISSION MODE | TRANSMISSION WAVE | OUTPUT ON | CONNECTED TO PA SIDE | ON | OFF (DISABLED) | CONNECTED TO SWR COMPUTING CIRCUIT SIDE (8a) |
| (2) | RECEPTION MODE | RECEPTION WAVE | OUTPUT OFF | CONNECTED TO CIR2 SIDE | OFF | OFF (DISABLED) | CONNECTED TO RECEPTION CIRCUIT SIDE (8b) |
| (3) | SWR MEASUREMENT MODE | TRAVELING WAVE (REFLECTED WAVE) | OUTPUT ON | CONNECTED TO CIR2 SIDE | OFF | ON (ENABLED) | CONNECTED TO SWR COMPUTING CIRCUIT SIDE (8c) |

STANDING WAVE RATIO MEASURING CIRCUIT AND COMMUNICATION APPARATUS

CROSS-REFERENCE TO RELATED APPLICATIONS

This application is based upon and claims the benefit of priority of the prior Japanese Patent Application No. 2009-266846, filed on Nov. 24, 2009, the entire contents of which are incorporated herein by reference.

FIELD

The present invention relates to a standing wave ratio measuring circuit and a communication apparatus provided in a transmitter/receiver that transmits and receives in a time-sharing manner.

BACKGROUND

In the related art, it is desired for a transmitter/receiver provided in a mobile communication base station for microwave-band communication to reduce power consumed by the transmitter/receiver and reduce the size and the cost of the transmitter/receiver. In order to achieve such goals, it is effective to reduce a pass loss of power caused in a unit of the transmitter/receiver after an amplifier circuit, that is, between the amplifier circuit and a transmission/reception antenna.

For the unit of the transmitter/receiver after the amplifier circuit, an SWR (Standing Wave Ratio) is measured using a transmission wave (traveling wave) output from the amplifier circuit during a transmission period and a reflected wave which is the traveling wave reflected in a cable by the transmission/reception antenna, or the like. The SWR represents the ratio of any reflected wave, which is reflected because of a mismatch between the impedance of the transmission/reception antenna connected to the cable and the impedance of the cable to the traveling wave.

A standing wave ratio measuring circuit according to the related art that measures the SWR described above will be described with reference to FIGS. 15 and 16. FIGS. 15 and 16 illustrate the standing wave ratio measuring circuit according to the related art. FIG. 15 is a block diagram illustrating the configuration of the standing wave ratio measuring circuit. FIG. 16 is a timing chart illustrating operation timing.

A standing wave ratio measuring circuit 9 includes a PA (Power Amplifier) 91, a CIR (Circulator) 92, and a detection circuit 93 that detects a traveling wave and a reflected wave. The standing wave ratio measuring circuit 9 further includes a BPF (Band Pass Filter) 94, a transmission/reception antenna 95, an SWR computing circuit 96, an ISO (Isolator) 97, and an LNA (Low Noise Amplifier) 98.

The PA 91 amplifies a transmission signal in a radio frequency band generated by a transmission processing unit (not illustrated). The CIR 92 supplies the high-power transmission wave amplified by the PA 91 to the detection circuit 93 during a transmission period, and supplies a reception wave supplied from the detection circuit 93 to the ISO 97. The detection circuit 93 includes two DCs (Directional Couplers) (DC1 and DC2) for high power usage.

The DC1 distributes the high-power transmission wave supplied from the CIR 92 to the SWR computing circuit 96 as a traveling wave, and also distributes the transmission wave to the DC2. The DC2 supplies the transmission wave distributed from the DC1 to the transmission/reception antenna 95 via the BPF 94. In a case where the supplied transmission wave is reflected at a location after the BPF 94, the DC2 detects the reflected wave via the BPF 94 to distribute the reflected wave to the SWR computing circuit 96, and also to supply the reflected wave to the DC1 as a reception wave.

The SWR computing circuit 96 measures the SWR using the traveling wave distributed from the DC1 and the reflected wave distributed from the DC2. The ISO 97 supplies the reception wave supplied from the CIR 92 to the LNA 98. The LNA 98 amplifies the reception wave supplied from the ISO 97 to supply the amplified reception wave to a reception processing unit (not illustrated) as a reception signal.

In the standing wave ratio measuring circuit 9, as illustrated in FIG. 15, a reception period and a transmission period are assigned in a time-sharing manner. During a transmission period, that is, when the operation mode is a transmission mode, the transmission wave is propagated, and at the same time, the SWR is measured using the traveling wave and the reflected wave. Meanwhile, during a reception period, that is, when the operation mode is a reception mode, the reception wave is propagated. Related techniques are disclosed in documents including Japanese Laid-open Patent Publication No. 2008-147934 and Japanese Laid-open Patent Publication No. 2004-286632.

In the standing wave ratio measuring circuit 9 according to the related art, part of the traveling wave and the reflected wave propagated during the transmission period and the reception period assigned in a time-sharing manner is extracted by the directional couplers (DC1 and DC2) at a location after the PA 91, which may increase the pass loss of power.

That is, the standing wave ratio measuring circuit 9 distributes a part of the transmission wave amplified by the PA 91 to the SWR computing circuit 96 using the DC1 as a traveling wave during the transmission period, and thus a radio wave corresponding to an amount for distribution is removed from the transmission wave, which increases the loss in power for that amount of the transmission wave. Also, the standing wave ratio measuring circuit 9 distributes a part of the reception wave supplied from the transmission/reception antenna 95 to the SWR computing circuit 96 using the DC2 during the reception period, and thus a radio wave corresponding to an amount for distribution is removed from the reception wave, which increases the loss in power for that amount of the reception wave.

Moreover, the transmission wave output from the PA 91 has high power, and thus the power gain of the transmission wave may be varied in some cases. In such cases, the transmission wave is distorted, as a result of which the signal level of the transmission wave (traveling wave) and the reflected wave for the traveling wave may not be detected accurately, which could increase errors in the measurement of the SWR.

The above events occur not only in mobile communication base stations, but also in radio apparatuses in general which include a transmission/reception antenna and in which the standing wave ratio is measured.

SUMMARY

According to an aspect of the invention, a standing wave ratio measuring circuit includes an amplifier circuit that amplifies a transmission signal; a first circulator that outputs the transmission signal amplified by the amplifier circuit in a direction of a transmission/reception antenna, and that outputs a reception signal received by the transmission/reception antenna to a reception system; a traveling wave acquiring unit that acquires the transmission signal before being input to the amplifier circuit as a traveling wave when a request to measure a standing wave ratio is detected; a traveling wave bypassing unit that allows the traveling wave acquired by the traveling wave acquiring unit to travel to the reception system while bypassing the amplifier circuit; a second circulator provided in the reception system to output the traveling wave bypassing the amplifier circuit through the traveling wave bypassing unit in a direction of the first circulator; a control unit that controls the amplifier circuit such that the traveling wave output from the second circulator travels in the direction of the transmission/reception antenna via the first circulator; a reflected wave acquiring unit that acquires a reflected wave, which is the traveling wave reflected in the vicinity of the transmission/reception antenna, at a location after the second circulator in the reception system; and a measuring circuit that measures the standing wave ratio using the traveling wave acquired by the traveling wave acquiring unit and the reflected wave acquired by the reflected wave acquiring unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates the content of control performed on various units in each operation mode according to the second embodiment;

FIG. 5 illustrates the content of control performed on various units in each operation mode according to a third embodiment;

FIG. 8 illustrates the content of control performed on various units in each operation mode according to the fifth embodiment;

FIG. 10 illustrates the content of control performed on various units in each operation mode according to the sixth embodiment;

FIG. 13 illustrates the content of control performed on various units in each operation mode according to the eighth embodiment;

DESCRIPTION OF EMBODIMENTS

A standing wave ratio measuring circuit and a communication apparatus according to embodiments disclosed herein will be described in detail below with reference to the drawings. A standing wave ratio measuring circuit for a mobile communication base station including a transmitter/receiver that operates in a time-sharing manner is described herein. The present invention is not limited to the embodiments, and is equally applicable to radio apparatuses that at least measure the standing wave ratio.

[First Embodiment]

Figure 1:
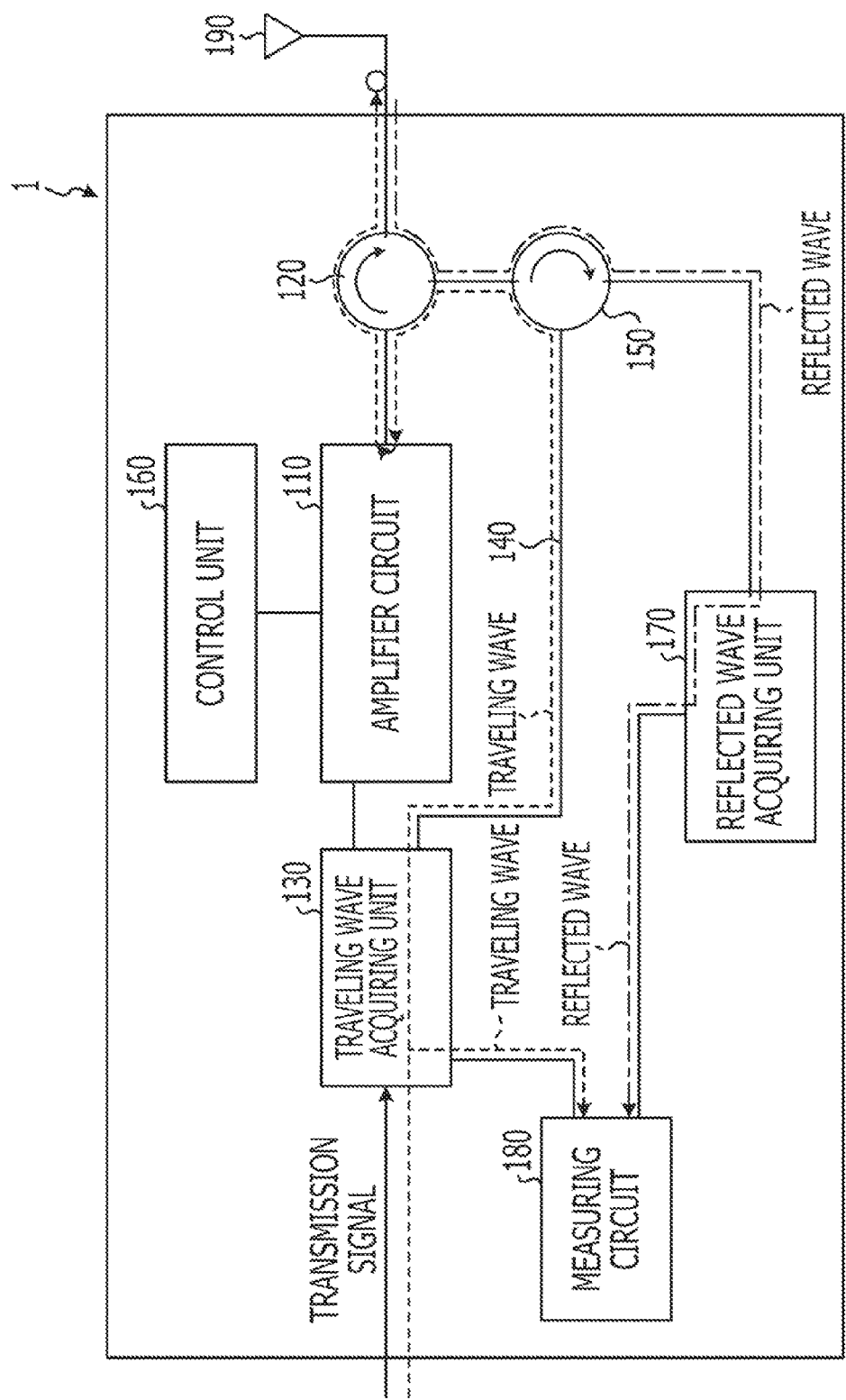
FIG. 1 is a functional block diagram illustrating the configuration of a standing wave ratio measuring circuit according to a first embodiment.

FIG. 1 is a functional block diagram illustrating the configuration of a standing wave ratio measuring circuit 1 according to a first embodiment. As illustrated in FIG. 1, the standing wave ratio measuring circuit 1 includes an amplifier circuit 110, a first circulator 120, a traveling wave acquiring unit 130, a traveling wave bypassing unit 140, a second circulator 150, a control unit 160, a reflected wave acquiring unit 170, a measuring circuit 180, and a transmission/reception antenna 190.

In the standing wave ratio measuring circuit 1, the traveling wave acquiring unit 130, the amplifier circuit 110, the first circulator 120, and the transmission/reception antenna 190 are connected in series to serve as a transmission system. Meanwhile, the first circulator 120, the second circulator 150, and the reflected wave acquiring unit 170 are connected in series to serve as a reception system. The traveling wave acquiring unit 130 and the second circulator 150 are connected through the traveling wave bypassing unit 140. The traveling wave acquiring unit 130 and the reflected wave acquiring unit 170 are each connected to the measuring circuit 180.

The amplifier circuit 110 amplifies a transmission signal. The first circulator 120 outputs the transmission signal amplified by the amplifier circuit 110 in the direction of the transmission/reception antenna 190, and outputs a reception signal received by the transmission/reception antenna 190 to the reception system. The traveling wave acquiring unit 130 acquires a traveling wave from the transmission signal before being input to the amplifier circuit 110 when a request to measure the standing wave ratio is detected.

The transmission signal refers to a signal for transmission output from a signal source of a transmitter. The traveling wave refers to a high-frequency signal having a predetermined level contained in the transmission signal. The transmission signal may be a modulated wave in which information is superimposed on a carrier wave, or may be a non-modulated wave which is simply a carrier wave.

The traveling wave bypassing unit 140 allows the traveling wave acquired by the traveling wave acquiring unit 130 to travel to the reception system while bypassing the amplifier circuit 110. That is, the traveling wave bypassing unit 140 allows the traveling wave to travel to the second circulator 150 located in the reception system to be discussed later.

The second circulator 150 is provided in the reception system, and outputs the traveling wave which bypasses the amplifier circuit 110 through the traveling wave bypassing unit 140 in the direction of the first circulator 120. The control unit 160 controls the amplifier circuit 110 so that the traveling wave output from the second circulator 150 travels in the direction of the transmission/reception antenna 190 via the first circulator 120.

The reflected wave acquiring unit 170 acquires a reflected wave, which is the traveling wave reflected in the vicinity of the transmission/reception antenna 190, at a location after the second circulator 150 in the reception system. The reflected wave is generated when the traveling wave is reflected because of a discontinuity between the respective impedances of the transmission/reception antenna 190 and a cable at a connection between the transmission/reception antenna 190 and the cable. The reflected wave is also generated when the traveling wave is reflected by the transmission/reception antenna 190 itself because of an abnormality with the transmission/reception antenna 190.

The measuring circuit 180 measures the standing wave ratio using the traveling wave acquired by the traveling wave acquiring unit 130 and the reflected wave acquired by the reflected wave acquiring unit 170. The Standing Wave Ratio (SWR) is a value indicating the relationship between the traveling wave and the reflected wave. The voltage ratio of the reflected wave to the traveling wave is specifically referred to as a voltage standing wave ratio (VSWR). In the description of the embodiment, the voltage standing wave ratio is used as the standing wave ratio.

Examples of the standing wave ratio will be described. In the case where the impedance of the cable and the impedance of the transmission/reception antenna 190 coincide with each other, no reflected wave is generated for the traveling wave, which thus results in a reflection coefficient of "0" and a standing wave ratio of "1.0". However, in the case where there is a mismatch between the respective impedances of the transmission/reception antenna 190 and the cable at the connection, the standing wave ratio will not be "1.0" because their impedances do not match each other. When the standing wave ratio is not "1.0", a reflected wave is generated for the traveling wave, which may cause degradation in performance of a reception process and cause physical damage to the amplifier circuit in the reception system. Accordingly, the measuring circuit 180 measures the standing wave ratio to detect possible causes of such abnormalities.

Thus, according to the standing wave ratio measuring circuit 1 of the first embodiment, the traveling wave is acquired before being input to the amplifier circuit 110. This eliminates the need to provide an additional component for acquiring the traveling wave at a location after the amplifier circuit 110, and prevents a pass loss of power caused by such a component. As a result, according to the standing wave ratio measuring circuit 1, the size and the cost of the amplifier circuit 110 can be reduced compared to a case where an additional component for acquiring the traveling wave is provided at a location after the amplifier circuit 110.

Moreover, according to the standing wave ratio measuring circuit 1, the traveling wave bypassing unit 140 allows the traveling wave to travel while bypassing the amplifier circuit 110. Thus, a low-power signal before being amplified can be used as the traveling wave, which reduces distortion of the traveling wave compared to a case where a high-power signal after being amplified is used as the traveling wave. Therefore, the standing wave ratio measuring circuit 1 can accurately detect the signal level of the traveling wave and the reflected wave for the traveling wave, allowing the SWR to be precisely measured.

Furthermore, according to the standing wave ratio measuring circuit 1, a low-power signal before being amplified can be used as the traveling wave, and thus even if the traveling wave is subjected to total reflection in the vicinity of the transmission/reception antenna 190, the reflected wave based on the total reflection also has low power. This prevents degradation of, and damage to the components provided in the reception system.

[Second Embodiment]
[Configuration of Standing Wave Ratio Measuring Circuit According to Second Embodiment]

Figure 2:
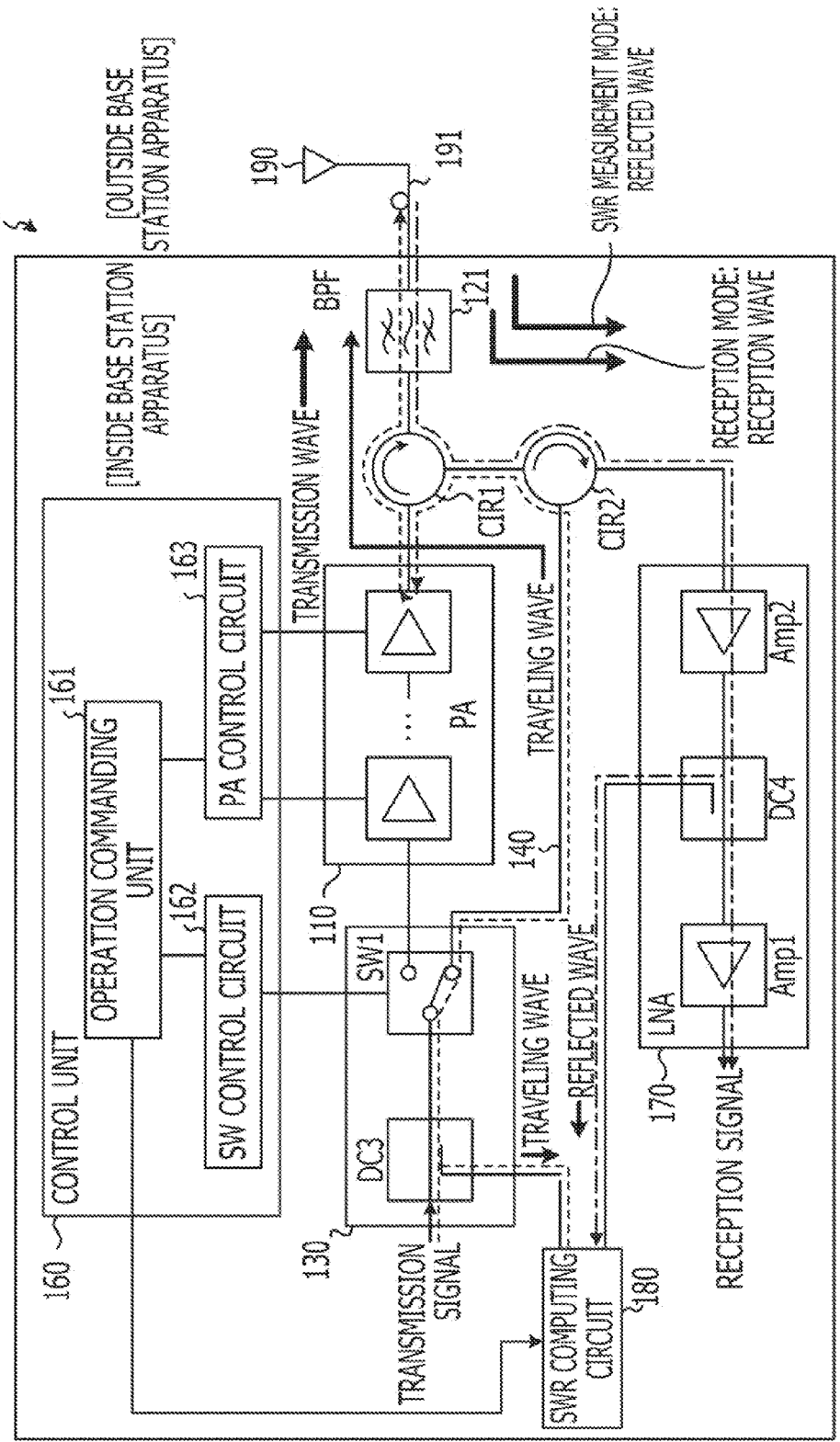
FIG. 2 is a functional block diagram illustrating the configuration of a standing wave ratio measuring circuit according to a second embodiment.

FIG. 2 is a functional block diagram illustrating the configuration of a standing wave ratio measuring circuit 2 according to a second embodiment. The standing wave ratio measuring circuit 2 includes an amplifier circuit (PA: Power Amp) 110, a CIR1 (Circulator 1), a BPF (Band Pass Filter) 121, a traveling wave acquiring unit 130, a traveling wave bypassing unit 140, a CIR2, and a control unit 160. The standing wave ratio measuring circuit 2 also includes a reflected wave acquiring unit (LNA: Low Noise Amp) 170 including a DC4, a measuring circuit (SWR computing circuit) 180, a transmission/reception antenna 190, and a cable 191. The traveling wave acquiring unit 130 includes a DC3 (Directional Coupler 3) and an SW1 (Switch 1). The control unit 160 includes an operation commanding unit 161, an SW control circuit 162, and a PA control circuit 163.

In the standing wave ratio measuring circuit 2, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, and the LNA 170 are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 and the DC4 included in the LNA 170 are each connected to the SWR computing circuit 180.

The PA 110 is a high-power amplifier with a multi-stage amplifier configuration for amplifying a transmission signal. The PA 110 amplifies an input transmission signal to high power to output the amplified transmission signal to the CIR1, to be discussed later, during a transmission interval (transmission period) assigned in a time-sharing manner.

The transmission signal refers to a signal for transmission output from a signal source of a transmitter. The traveling wave refers to a high-frequency (RF: Radio Frequency) signal having a predetermined level contained in the transmission signal. The transmission signal may be a modulated wave in which information is superimposed on a carrier wave, or may be a non-modulated wave which is simply a carrier wave.

The CIR1 is a first circulator, and outputs the transmission signal amplified by the PA 110 in the direction of the transmission/reception antenna 190. The CIR1 also outputs a reception signal received by the transmission/reception antenna 190 in the direction of the reception system. The CIR1 further outputs in the direction of the PA 110 a traveling wave input from the CIR2, which will be discussed later.

The BPF 121 is a band pass filter, and transmits only frequencies in a pass band and attenuates frequencies outside the pass band.

The DC3 is a directional coupler a kind of coupler that couples and distributes a transmission signal. When a request to measure the standing wave ratio is detected, the DC3 extracts a transmission signal before being input to the PA 110 as a traveling wave to distribute the extracted traveling wave. Specifically, when a request to measure the standing wave ratio is detected, the DC3 extracts a transmission signal as a traveling wave to distribute the extracted traveling wave to the SW1 and the SWR computing circuit 180 to be discussed later.

The SW1 is an SPDT (Single Pole Double Throw) switch, and switches the travel destination of the traveling wave between the PA 110 and the traveling wave bypassing unit 140. The SW1 is preferably an inexpensive reflective SPDT switch with no anti-reflection terminator provided inside. However, the SW1 may be an expensive non-reflective SPDT switch with an anti-reflection terminator with an impedance of 50 ohm (Ω), for example, provided inside.

The traveling wave bypassing unit 140 allows the traveling wave acquired by the traveling wave acquiring unit 130 to travel to the reception system while bypassing the PA 110. Specifically, the traveling wave bypassing unit 140 is wiring that allows the traveling wave input via the SW1 to travel to the CIR2, to be discussed later.

The CIR2 is a second circulator, and is provided in the reception system to output the traveling wave input from the SW1 in the direction of the CIR1. The CIR2 also outputs a reception signal input from the CIR1 in the direction of the LNA 170.

When an interval (hereinafter referred to as a "guard-time interval") is entered that is not overlapped by a transmission interval and a reception interval, the operation commanding unit 161 provides the SW control circuit 162 and the PA control circuit 163 with a request to measure the standing wave ratio. When a transmission interval is entered, the operation commanding unit 161 provides the SW control circuit 162 and the PA control circuit 163 with a request to transmit a transmission signal. When a reception interval is entered, the operation commanding unit 161 provides the SW control circuit 162 and the PA control circuit 163 with a request to receive a reception signal. The guard-time interval, the transmission interval, and the reception interval are assigned in advance in a time-sharing manner. An operation mode used during the guard-time interval is referred to as an "SWR measurement mode". An operation mode used during the transmission interval is referred to as a "transmission mode". An operation mode used during the reception interval is referred to as a "reception mode".

The SW control circuit 162 commands the SW1 to switch the connection destination in response to the various requests from the operation commanding unit 161. Specifically, when a request from the operation commanding unit 161 to measure the standing wave ratio is detected, the SW control circuit 162 commands the SW1 to switch the connection destination to the traveling wave bypassing unit 140 side for the purpose of causing the traveling wave to travel to the traveling wave bypassing unit 140. Also, when a request from the operation commanding unit 161 to transmit a transmission signal is detected, the SW control circuit 162 commands the SW1 to switch the connection destination to the PA 110 side for the purpose of causing the traveling wave to travel to the PA 110.

Further, when a request from the operation commanding unit 161 to receive a reception signal is detected, the SW control circuit 162 commands the SW1 to switch the connection destination to the traveling wave bypassing unit 140 side. This is intended to provide a path on the SW1 side with respect to the CIR2 with the same resistance (for example, 50Ω) as the impedance of the SW1. That is, with the CIR2 and the SW1 connected to each other, even if the reception signal is reflected by the LNA 170 to flow backward in the reception system during the reception interval, the reflected wave flowing backward flows in the direction of the SW1 via the CIR2, which prevents the reflected wave from flowing backward in the direction of the transmission/reception antenna 190.

In the case where the SW1 is a non-reflective SPDT switch, similar results are obtained during the reception interval, even if the connection destination is the PA 110 side, if the impedance of the terminator included in the SW1 and the impedance of the path on the SW1 side with respect to the CIR2 are identical. In this case, the SW control circuit 162 may command the SW1 to switch the connection destination to the PA 110 side when a request from the operation commanding unit 161 to receive a reception signal is detected.

The PA control circuit 163 controls the PA 110 in response to the various requests from the operation commanding unit 161. Specifically, when a request from the operation commanding unit 161 to measure the standing wave ratio is detected, the PA control circuit 163 controls the voltage of the PA 110 so that the traveling wave output from the CIR2 travels in the direction of the transmission/reception antenna 190 via the CIR1. For example, in the case where the PA 110 is formed by a Field-Effect Transistor (FET), the PA control circuit 163 performs control so as to set the operating-point voltage of the PA 110 to a pinch-off voltage. The pinch-off voltage refers to a control voltage applied to the gate terminal of the FET that brings the drain current to a value of "0".

Figure 3:
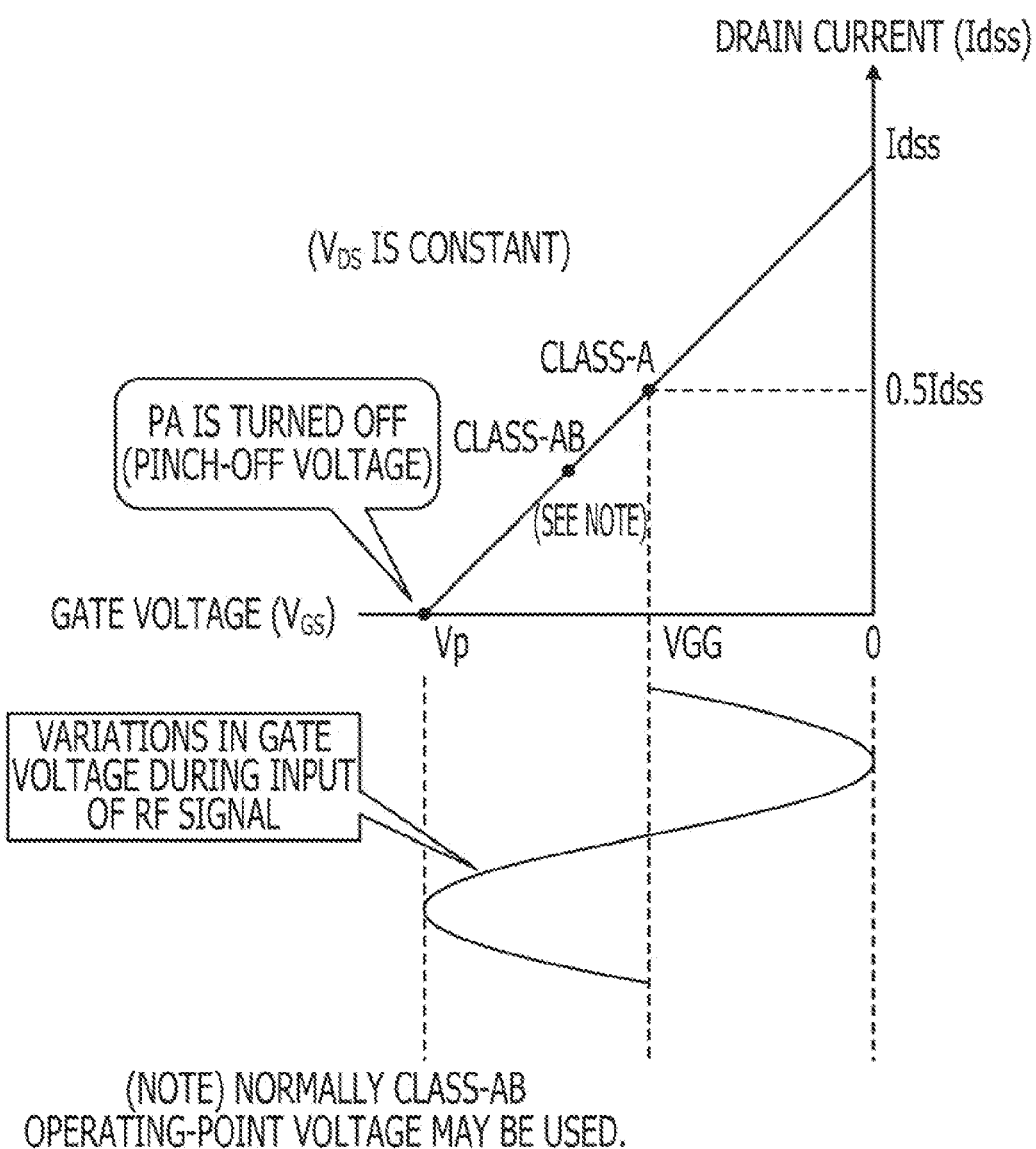
FIG. 3 illustrates PA control performed in the standing wave ratio measuring circuit.

PA control performed by the PA control circuit 163 will be described with reference to FIG. 3. FIG. 3 illustrates PA control performed in the standing wave ratio measuring circuit 2. As illustrated in FIG. 3, the X coordinate indicates the value of the control voltage (gate voltage: $V_{GS}$) applied to the gate terminal of the FET, and the Y coordinate indicates the value of the drain current (Idss). In the example of FIG. 3, the drain-source voltage ($V_{DS}$) is constant. Thus, the drain current is saturated to reach its maximum value when the gate voltage is "0", which indicates that the drain current becomes "0" at a certain voltage ($V_P$) while reducing the gate voltage. Such a voltage is the pinch-off voltage.

Specifically, during a transmission interval in which the operation mode is the transmission mode, the PA control circuit 163 controls the gate voltage to a class-A operating point at which the transmission signal is not distorted. In the example of FIG. 3, the gate voltage is controlled to "$V_{GG}$" so that the drain current is "0.5"×Idss. Then, during a guard-time interval in which the operation mode is the SWR measurement mode, the PA control circuit 163 controls the gate voltage to the pinch-off voltage. In the example of FIG. 3, the gate voltage is controlled to "$V_p$" so that the drain current is "0"×Idss. "$V_p$" is a voltage value around "−2.0 volts (V)", for example.

Consequently, the PA control circuit 163 controls the gate voltage of the FET forming the PA 110 to the pinch-off voltage when the operation mode is the SWR measurement mode, which makes it possible to bring the drain current to "0" and turn off the operation of the PA 110. As a result, the output impedance of the PA 110 is reduced, and thus the PA 110 can reflect the input signal by an amount corresponding to the reduction in output impedance. That is, the PA 110 can almost totally reflect the traveling wave output from the CIR1 toward the PA 110 to cause the traveling wave to travel in the direction of the transmission/reception antenna 190 via the CIR1.

Returning to FIG. 2, when a request from the operation commanding unit 161 to transmit a transmission signal is detected, the PA control circuit 163 controls the operating-point voltage of the PA 110 to the class-A operating-point voltage. The PA control circuit 163 may control the operating-point voltage to a class-AB operating-point voltage in place of the class-A operating-point voltage. When a request from the operation commanding unit 161 to receive a reception signal is detected, the PA control circuit 163 performs control so as to turn off the operation of the PA 110. For example, the PA control circuit 163 may perform control so as to set the operating-point voltage of the PA 110 to the pinch-off voltage as in the case where a request to measure the standing wave ratio is detected, or may perform control so as to turn off the power of the PA 110.

The LNA 170 is a low noise amplifier with a multi-stage amplifier configuration including a plurality of amplifiers 1 and 2 (Amp1 and Amp2). The LNA 170 amplifies a reception signal input to the LNA 170.

The DC4 is a directional coupler, a kind of coupler that couples and distributes a reception signal. The DC4 is interposed between two amplifiers, of the plurality of amplifiers, and extracts a reception signal as a reflected wave to distribute the extracted reflected wave. Specifically, the DC4 extracts a reception signal amplified by the Amp2 as a reflected wave to distribute the extracted reflected wave to the SWR computing circuit 180 and the Amp1.

The SWR computing circuit 180 measures the standing wave ratio using the traveling wave acquired by the DC3 and the reflected wave acquired by the DC4. Specifically, the SWR computing circuit 180 adjusts the voltage of the reception signal, which has been amplified by the Amp2, to the voltage before being amplified to measure the standing wave ratio using the reception signal (reflected wave) with the adjusted voltage and the traveling wave.

Next, the content of control performed on various units in each operation mode will be described with reference to FIG. 4. FIG. 4 illustrates the content of control performed on various units in each operation mode. As illustrated in FIG. 4, the various units are controlled depending on whether the operation mode is the transmission mode, the reception mode, or the SWR measurement mode.

When a transmission interval in which the operation mode is a transmission mode 2a is entered, a transmission wave (transmission signal) is propagated in the direction of the transmission/reception antenna 190, which turns "ON" the output of the transmission signal. At this time, the operation commanding unit 161 provides the SW control circuit 162 and the PA control circuit 163 with a request to transmit a transmission signal. Then, the SW control circuit 162 commands the SW1 to switch the connection destination to the PA 110 side, which causes the SW1 to be "connected to the PA 110 side". Meanwhile, the PA control circuit 163 controls the operating-point voltage of the PA 110 to the class-A operating-point voltage, which turns "ON" the operation of the PA 110. Further, the operation commanding unit 161 commands the SWR computing circuit 180 to be disabled. The operation of the SWR computing circuit 180 is turned "OFF".

Consequently, when a transmission interval is entered, a transmission wave (transmission signal) travels from the SW1 to the PA 110 to be amplified by the PA 110, and is output to the transmission/reception antenna 190 by way of the CIR1.

When a reception interval in which the operation mode is a reception mode 2b is entered, a reception wave received by the transmission/reception antenna 190 is propagated in the direction of the reception system, which turns "OFF" the output of the transmission signal. At this time, the operation commanding unit 161 provides the SW control circuit 162 and the PA control circuit 163 with a request to receive a reception signal. Then, the SW control circuit 162 commands the SW1 to switch the connection destination to the CIR2 side, which causes the SW1 to be "connected to the CIR2 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Furthermore, the operation commanding unit 161 commands the SWR computing circuit 180 to be disabled. The operation of the SWR computing circuit 180 is turned "OFF".

Consequently, when a reception interval is entered, a reception wave is output from the transmission/reception antenna 190 to a reception circuit (not illustrated), which processes a reception signal, by way of the CIR1 and the CIR2.

When a guard-time interval in which the operation mode is an SWR measurement mode 2c is entered, a traveling wave is propagated in the direction of the transmission/reception antenna 190, which turns "ON" the output of the transmission signal (traveling wave). At this time, the operation commanding unit 161 provides the SW control circuit 162 and the PA control circuit 163 with a request to measure the standing wave ratio. Then, the SW control circuit 162 commands the SW1 to switch the connection destination to the CIR2 side, which causes the SW1 to be "connected to the CIR2 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Further, the operation commanding unit 161 commands the SWR computing circuit 180 to be enabled, which turns "ON" the operation of the SWR computing circuit 180.

Consequently, when a guard-time interval is entered, a traveling wave is output to the SWR computing circuit 180 via the DC3, and also travels from the SW1 to the CIR2 via the traveling wave bypassing unit 140 to travel in the direction of the PA 110 by way of the CIR2 and the CIR1. Then, the traveling wave is almost totally reflected by the PA 110, and output to the transmission/reception antenna 190 by way of the CIR1. Further, the reflected wave, which is the traveling wave reflected in the vicinity of the transmission/reception antenna 190, is output to the SWR computing circuit 180 by way of the CIR1 and the CIR2 via the DC4. As a result, the SWR computing circuit 180 measures the standing wave ratio using the traveling wave and the reflected wave.

According to the standing wave ratio measuring circuit 2 of the second embodiment, the traveling wave acquiring unit 130 includes the DC3, which extracts a transmission signal as a traveling wave to distribute the extracted traveling wave, and the SW1. The SW1 allows the traveling wave to travel to the traveling wave bypassing unit 140 using a path capable of switching the travel destination of the traveling wave between the PA 110 and the traveling wave bypassing unit 140. Consequently, in the standing wave ratio measuring circuit 2, the DC3 acquires the traveling wave before being input to the amplifier circuit 110, which eliminates the need to provide an additional component for acquiring the traveling wave at a location after the amplifier circuit 110, and prevents a pass loss of power caused by such a component. As a result, according to the standing wave ratio measuring circuit 2, the size and the cost of the amplifier circuit 110 can be reduced compared to a case where an additional component for acquiring the traveling wave is provided at a location after the amplifier circuit 110.

Moreover, according to the standing wave ratio measuring circuit 2 of the second embodiment, the PA control circuit 163 performs control so as to set the operating-point voltage of the PA 110 to the pinch-off voltage when a request to measure the standing wave ratio is detected. Consequently, the PA control circuit 163 sets the operating-point voltage of the PA 110 to the pinch-off voltage, and thus the drain current is brought to "0". Therefore, the PA control circuit 163 can reduce the output impedance of the PA 110, and the traveling wave entering the PA 110 can be reflected by an amount corresponding to the reduction in output impedance. As a result, in the standing wave ratio measuring circuit 2, the traveling wave is allowed to travel in the direction of the transmission/reception antenna 190 without requiring any extra component provided at a location after the PA 110.

Furthermore, according to the standing wave ratio measuring circuit 2 of the second embodiment, the LNA 170 includes a plurality of amplifiers for amplifying the reflected wave, and the DC4 interposed between two of the plurality of amplifiers to distribute the reflected wave. Consequently, the DC4 is provided in the LNA 170 in the standing wave ratio measuring circuit 2, and thus degradation in NF (Noise Figure) of the LNA 170 can be reduced compared to a case where the DC4 is provided at a location before the LNA 170 in the reception system.

In addition, according to the standing wave ratio measuring circuit 2 of the second embodiment, the DC3 of the traveling wave acquiring unit 130 acquires a transmission signal as a traveling wave when a request to measure the standing wave ratio is detected during a guard-time interval, which is not overlapped by a transmission interval and a reception interval assigned in a time-sharing manner. Consequently, the standing wave ratio measuring circuit 2 can measure the standing wave ratio without being affected by a transmission signal transmitted during a transmission interval, or by a reception signal received during a reception interval.

[Third Embodiment]

In the standing wave ratio measuring circuit 2 according to the second embodiment, the standing wave ratio is measured when a "guard-time interval" that is not overlapped by a transmission interval and a reception interval is entered. However, a standing wave ratio measuring circuit 3 is not limited to such a configuration, and the standing wave ratio may be measured when a "predetermined part of a reception interval" is entered.

The "predetermined part of a reception interval" refers to a part of a reception interval that is not overlapped by an operating period, and may be a period in which a base station apparatus is tested or maintained, or a time slot in an operating period in which no connection is established with a mobile unit. In the embodiment, the operation mode used during a "predetermined part of a reception interval" is specifically referred to as an "SWR measurement mode". That is, the operation mode used in a part of a reception interval in which a reception signal is received is referred to as a "reception mode", and the operation mode used in a part of a reception interval in which the standing wave ratio is measured is referred to as an "SWR measurement mode".

Thus, in a third embodiment, the standing wave ratio is measured when a predetermined part of a reception interval is entered. The functional block diagram illustrating the configuration of the standing wave ratio measuring circuit 3 according to the third embodiment is the same as the functional block diagram of the standing wave ratio measuring circuit 2 according to the second embodiment, and thus the configuration of the standing wave ratio measuring circuit 3 is not described.

Next, the content of control performed on various units in each operation mode will be described with reference to FIG. 5. FIG. 5 illustrates the content of control performed on various units in each operation mode. As illustrated in FIG. 5, the various units are controlled depending on whether the operation mode is the transmission mode, the reception mode, or the SWR measurement mode. Operations performed when the operation mode is a transmission mode 3a and a reception mode 3b are the same as the corresponding operations performed in the second embodiment (FIG. 4), and thus are not described.

When a predetermined part of a reception interval, in which the operation mode is an SWR measurement mode 3c, is entered, a traveling wave is propagated in the direction of the transmission/reception antenna 190, which turns "ON" the output of the transmission signal (traveling wave). At this time, the operation commanding unit 161 provides the SW control circuit 162 and the PA control circuit 163 with a request to measure the standing wave ratio. Then, the SW control circuit 162 commands the SW1 to switch the connection destination to the CIR2 side, which causes the SW1 to be "connected to the CIR2 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Furthermore, the operation commanding unit 161 commands the SWR computing circuit 180 to be enabled, which turns "ON" the operation of the SWR computing circuit 180.

Consequently, when a predetermined part of a reception interval is entered, the traveling wave is output to the SWR computing circuit 180 via the DC3, and also travels from the SW1 to the CIR2 via the traveling wave bypassing unit 140 to travel in the direction of the PA 110 by way of the CIR2 and the CIR1. Then, the traveling wave is almost totally reflected by the PA 110, and output to the transmission/reception antenna 190 by way of the CIR1. Further, the reflected wave, which is the traveling wave reflected in the vicinity of the transmission/reception antenna 190, is output to the SWR computing circuit 180 by way of the CIR1 and the CIR2 via the DC4. As a result, the SWR computing circuit 180 measures the standing wave ratio using the traveling wave and the reflected wave.

According to the standing wave ratio measuring circuit 3 of the third embodiment, the DC3 of the traveling wave acquiring unit 130 acquires a transmission signal as a traveling wave when a request to measure the standing wave ratio is detected during a predetermined part of a reception period. Consequently, by defining a maintenance period or a period that does not affect operation in a reception period as a predetermined period, the standing wave ratio measuring circuit 3 can make effective use of idle time during an operating period to measure the standing wave ratio.

[Fourth Embodiment]

In the standing wave ratio measuring circuit 2 according to the second embodiment, the DC3 which distributes the traveling wave to the SWR computing circuit 180 is provided in the transmission system at a location before the PA 110 with respect to the travel direction of the transmission signal. However, a standing wave ratio measuring circuit 4 is not limited to such a configuration, and the DC3 which distributes the traveling wave to the SWR computing circuit 180 may be provided in the traveling wave bypassing unit 140. Thus, in a standing wave ratio measuring circuit according 4 to a fourth embodiment, the DC3 which distributes the traveling wave to the SWR computing circuit 180 is provided in the traveling wave bypassing unit 140.

Figure 6:
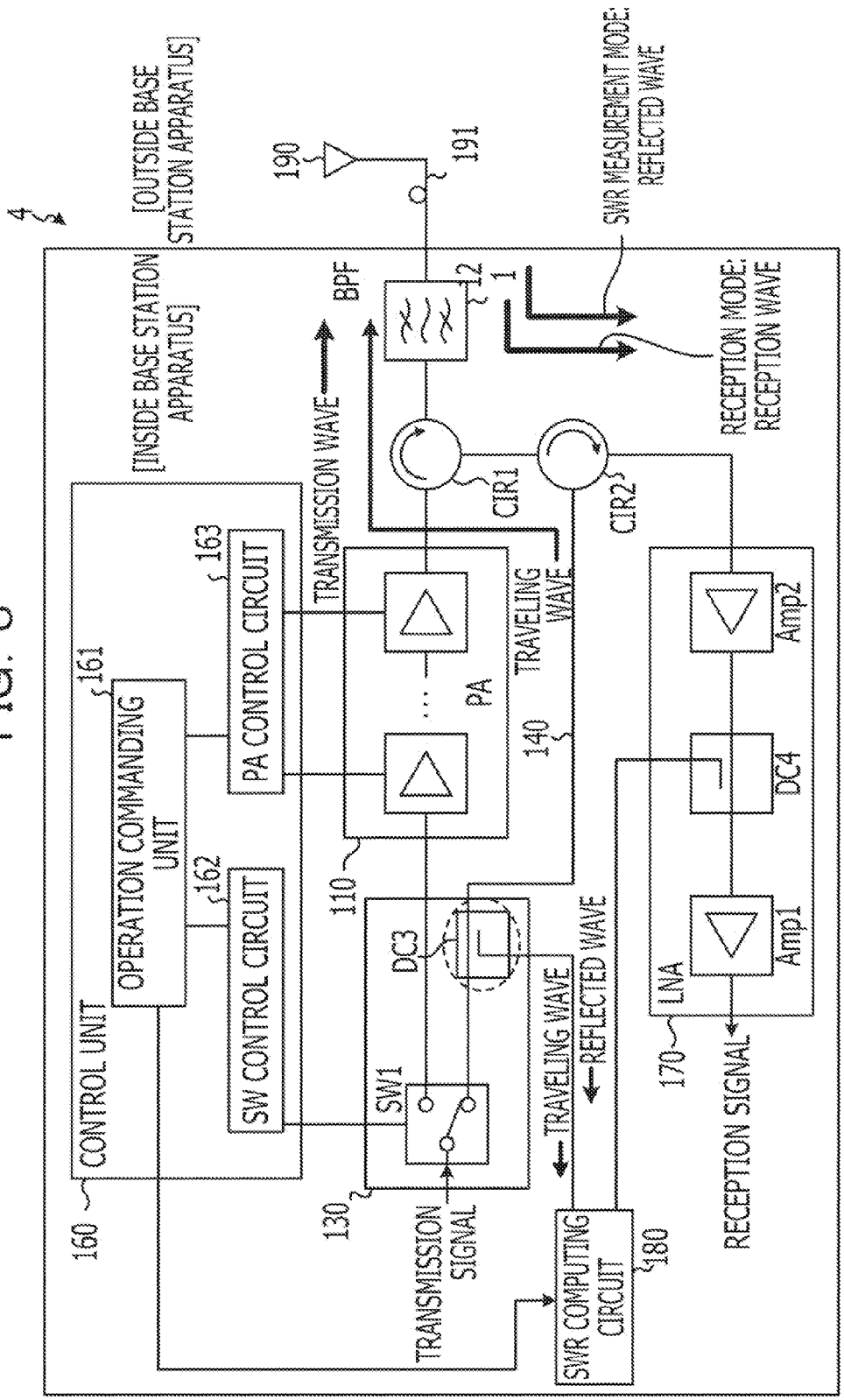
FIG. 6 is a functional block diagram illustrating the configuration of a standing wave ratio measuring circuit according to a fourth embodiment.

First, the configuration of the standing wave ratio measuring circuit 4 according to the fourth embodiment will be described. FIG. 6 is a functional block diagram illustrating the configuration of the standing wave ratio measuring circuit 4 according to the fourth embodiment. Components that are the same as the components of the standing wave ratio measuring circuit 2 illustrated in FIG. 2 are denoted by the same reference symbols to omit redundant description of the components and their operations. The fourth embodiment is different from the second embodiment in that the locations of the DC3 and the SW1 have been changed.

In the standing wave ratio measuring circuit 4, the SW1 included in the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, and the LNA 170 are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 is provided in the traveling wave bypassing unit 140, and is connected to each of the SW1 and the CIR2. The DC3 and the DC4 included in the reflected wave acquiring unit 170 are each connected to the measuring circuit 180.

The SW1 is an SPDT switch, and switches the travel destination of the transmission signal between the PA 110 and the DC3. The SW1 is preferably a non-reflective SPDT switch provided with an anti-reflection terminator with an impedance of 50 ohm (Ω), for example.

The DC3 is a directional coupler, a type of coupler that couples and distributes a transmission signal. The DC3 extracts a transmission signal traveling from the SW1 as a traveling wave to distribute the extracted traveling wave. Specifically, the DC3 extracts a transmission signal having passed through the SW1 as a traveling wave to distribute the extracted traveling wave to the SWR computing circuit 180 and the CIR2.

The content of control performed on various units of the standing wave ratio measuring circuit 4 in each operation mode according to the fourth embodiment is the same as the corresponding operation performed in the second embodiment (FIG. 4), and thus is not described.

According to the standing wave ratio measuring circuit 4 of the fourth embodiment, the traveling wave acquiring unit 130 includes the SW1 which allows the transmission signal to reach to the traveling wave bypassing unit 140 using a path capable of switching the transmission destination of the transmission signal between the PA 110 and the traveling wave bypassing unit 140, and the DC3. The DC3 is provided in the traveling wave bypassing unit 14, and extracts a transmission signal as a traveling wave to distribute the extracted traveling wave. Consequently, in the standing wave ratio measuring circuit 4, the DC3 is provided in a transfer path (traveling wave bypassing unit 140) that is not in the transmission system, and thus the configuration of the components in the transmission system can be simplified.

[Fifth Embodiment]

In the standing wave ratio measuring circuit 2 according to the second embodiment, no component is provided in the traveling wave bypassing unit 140 between the SW1 and the CIR2. However, a standing wave ratio measuring circuit 5 is not limited to such a configuration, and an SW3 may be provided in the traveling wave bypassing unit 140 between the SW1 and the CIR2. Thus, in a standing wave ratio measuring circuit 5 according to a fifth embodiment, the SW3 is provided in the traveling wave bypassing unit 140 between the SW1 and the CIR2.

Figure 7:
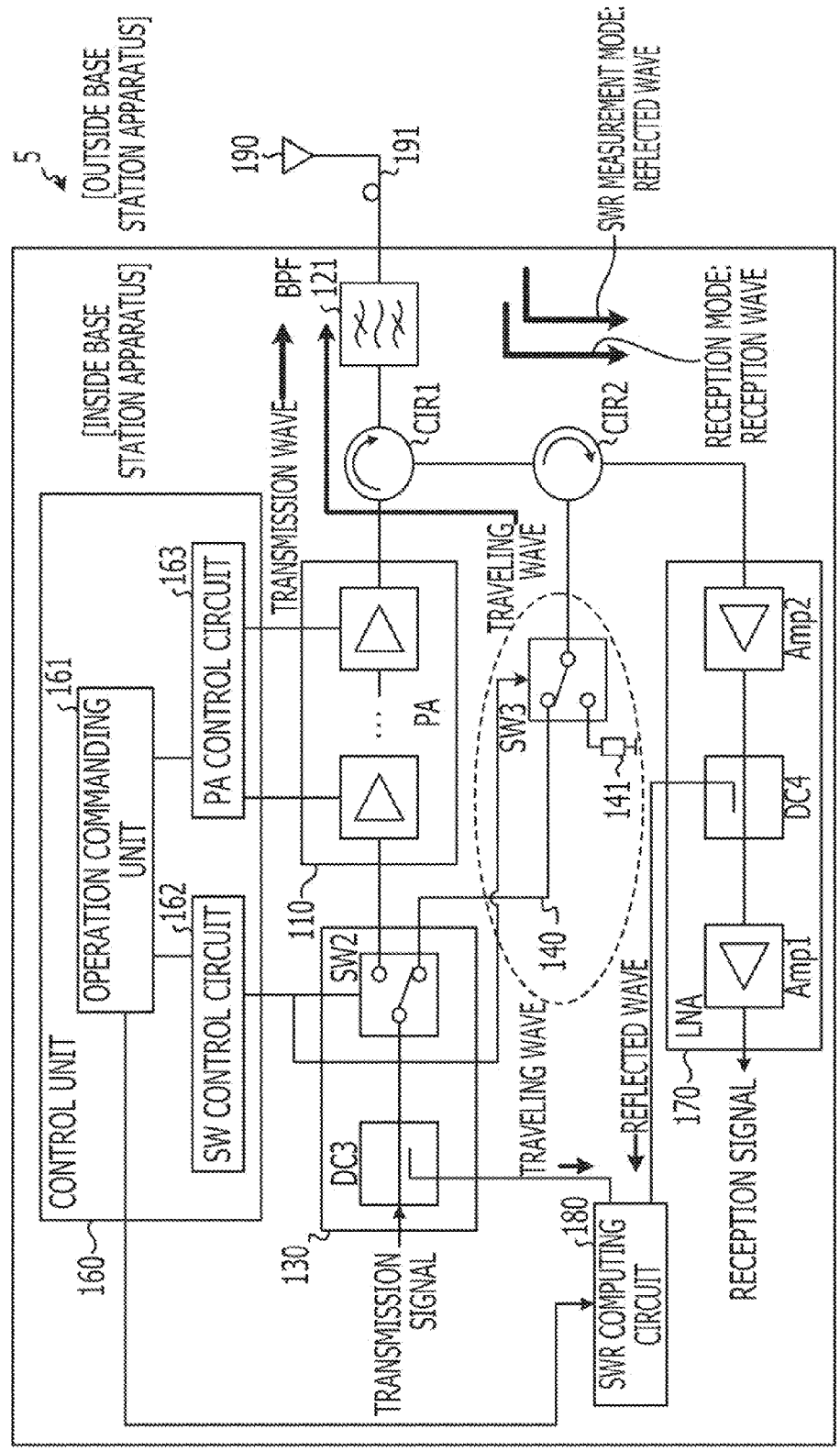
FIG. 7 is a functional block diagram illustrating the configuration of a standing wave ratio measuring circuit according to a fifth embodiment.

First, the configuration of the standing wave ratio measuring circuit 5 according to the fifth embodiment will be described. FIG. 7 is a functional block diagram illustrating the configuration of the standing wave ratio measuring circuit 5 according to the fifth embodiment. Components that are the same as the components of the standing wave ratio measuring circuit 2 illustrated in FIG. 2 are denoted by the same reference symbols to omit redundant description of the components and their operations. The fifth embodiment is different from the second embodiment in that the SW3 has been added to the traveling wave bypassing unit 140 and that the SW1 has been replaced with an SW2.

In the standing wave ratio measuring circuit 5, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, and the LNA 170 are connected in series to serve as a reception system. The SW2 included in the traveling wave acquiring unit 130 and the CIR2 are connected through the traveling wave bypassing unit 140. The DC3 included in the traveling wave acquiring unit 130 and the DC4 included in the reflected wave acquiring unit 170 are each connected to the measuring circuit 180. The SW3 is provided in the traveling wave bypassing unit 140, and is connected to each of the SW2 and the CIR2.

The SW2 is an SPDT switch, and switches the travel destination of the traveling wave between the PA 110 and the traveling wave bypassing unit 140. The SW2 is preferably a reflective SPDT switch with no anti-reflection terminator provided inside.

The SW3 is an SPDT switch, and is connected to a terminator 141 that terminates with an impedance of 50Ω, for example. The SW3 switches the travel destination of the reflected wave, which is the reception signal reflected by the LNA 170, between the SW2 and the terminator 141. In order to stabilize the characteristics of the CIR2 which causes little reflection by nature, the SW3 is preferably provided in the vicinity of the CIR2. That is, when the reception signal is reflected by the LNA 170, the reflected wave travels from the CIR2 to the SW3, and the SW3 reliably causes the reflected wave to travel to the terminator 141. As a result, the characteristics of the CIR2 are stabilized.

Next, the content of control performed on various units in each operation mode will be described with reference to FIG. 8. FIG. 8 illustrates the content of control performed on various units in each operation mode. As illustrated in FIG. 8, the various units are controlled depending on whether the operation mode is the transmission mode, the reception mode, or the SWR measurement mode.

When a transmission interval in which the operation mode is a transmission mode 5a is entered, a transmission wave (transmission signal) is propagated in the direction of the transmission/reception antenna 190, which turns "ON" the output of the transmission signal. At this time, the operation commanding unit 161 provides the SW control circuit 162 and the PA control circuit 163 with a request to transmit a transmission signal. Then, the SW control circuit 162 commands the SW2 to switch the connection destination to the PA 110 side, which causes the SW2 to be "connected to the PA 110 side". The SW control circuit 162 also commands the SW3 to switch the connection destination to the terminator 141 side, which causes the SW3 to be "connected to the terminator 141 side". Meanwhile, the PA control circuit 163 controls the operating-point voltage of the PA 110 to the class-A operating-point voltage, which turns "ON" the operation of the PA 110. Also, the operation commanding unit 161 commands the SWR computing circuit 180 to be disabled, which turns "OFF" the operation of the SWR computing circuit 180.

Consequently, when a transmission interval is entered, a transmission wave (transmission signal) travels from the SW2 to the PA 110 to be amplified by the PA 110, and is output to the transmission/reception antenna 190 by way of the CIR1.

When a reception interval in which the operation mode is a reception mode 5b is entered, a reception wave received by the transmission/reception antenna 190 is propagated in the direction of the reception system, which turns "OFF" the output of the transmission signal. At this time, the operation commanding unit 161 provides the SW control circuit 162 and the PA control circuit 163 with a request to receive a reception signal. Then, the SW control circuit 162 commands the SW2 to switch the connection destination to the CIR2 side, which causes the SW2 to be "connected to the CIR2 side". The SW control circuit 162 also commands the SW3 to switch the connection destination to the terminator 141 side, which causes the SW3 to be "connected to the terminator 141 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Furthermore, the operation commanding unit 161 commands the SWR computing circuit 180 to be disabled. The operation of the SWR computing circuit 180 is turned "OFF".

Consequently, when a reception interval is entered, a reception wave is output from the transmission/reception antenna 190 to a reception circuit (not illustrated), which processes a reception signal, by way of the CIR1 and the CIR2. When the reception wave is reflected by the LNA 170, the reflected wave is output from the CIR2 to the terminator 141 via the SW3.

When a guard-time interval in which the operation mode is an SWR measurement mode 5c is entered, a traveling wave is propagated in the direction of the transmission/reception antenna 190, which turns "ON" the output of the transmission signal (traveling wave). At this time, the operation commanding unit 161 provides the SW control circuit 162 and the PA control circuit 163 with a request to measure the standing wave ratio. Then, the SW control circuit 162 commands the SW2 to switch the connection destination to the CIR2 side, which causes the SW2 to be "connected to the CIR2 side". The SW control circuit 162 also commands the SW3 to switch the connection destination to the SW2 side, which causes the SW3 to be "connected to the SW2 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Also, the operation commanding unit 161 commands the SWR computing circuit 180 to be enabled. The operation of the SWR computing circuit 180 is turned "ON".

Consequently, when a guard-time interval is entered, a traveling wave is output to the SWR computing circuit 180 via the DC3, and also travels from the SW2 to the CIR2 via the SW3 to travel in the direction of the PA 110 by way of the CIR2 and the CIR1. Then, the traveling wave is almost totally reflected by the PA 110, and output to the transmission/reception antenna 190 by way of the CIR1. Furthermore, the reflected wave, which is the traveling wave reflected in the vicinity of the transmission/reception antenna 190, is output to the SWR computing circuit 180 by way of the CIR1 and the CIR2 via the DC4. As a result, the SWR computing circuit 180 measures the standing wave ratio using the traveling wave and the reflected wave.

According to the standing wave ratio measuring circuit 5 of the fifth embodiment, the traveling wave bypassing unit 140 includes the SW3 provided in the vicinity of the CIR2. The SW3 allows the reflected wave, which is the reception signal reflected by the LNA 170, to travel to the terminator 141, which terminates with an impedance of 50Ω, for example, using a path capable of switching the travel destination of the reflected wave between the SW2 and the terminator 141. Consequently, in the standing wave ratio measuring circuit 5, the reflected wave reflected by the LNA 170 can be made to pass to the SW3 provided in the vicinity of the CIR2, and thus reliably from the SW3 to the terminator 141. As a result, in the standing wave ratio measuring circuit 5, the characteristics of the CIR2 which causes little reflection can be stabilized.

[Sixth Embodiment]

In the standing wave ratio measuring circuit 2 according to the second embodiment, the DC4 is provided in the LNA 170. However, a standing wave ratio measuring circuit 6 is not limited to such a configuration, and an SW4 may be provided in the LNA 170. Thus, in a standing wave ratio measuring circuit 6 according to a sixth embodiment, the SW4 is provided in the LNA 170.

Figure 9:
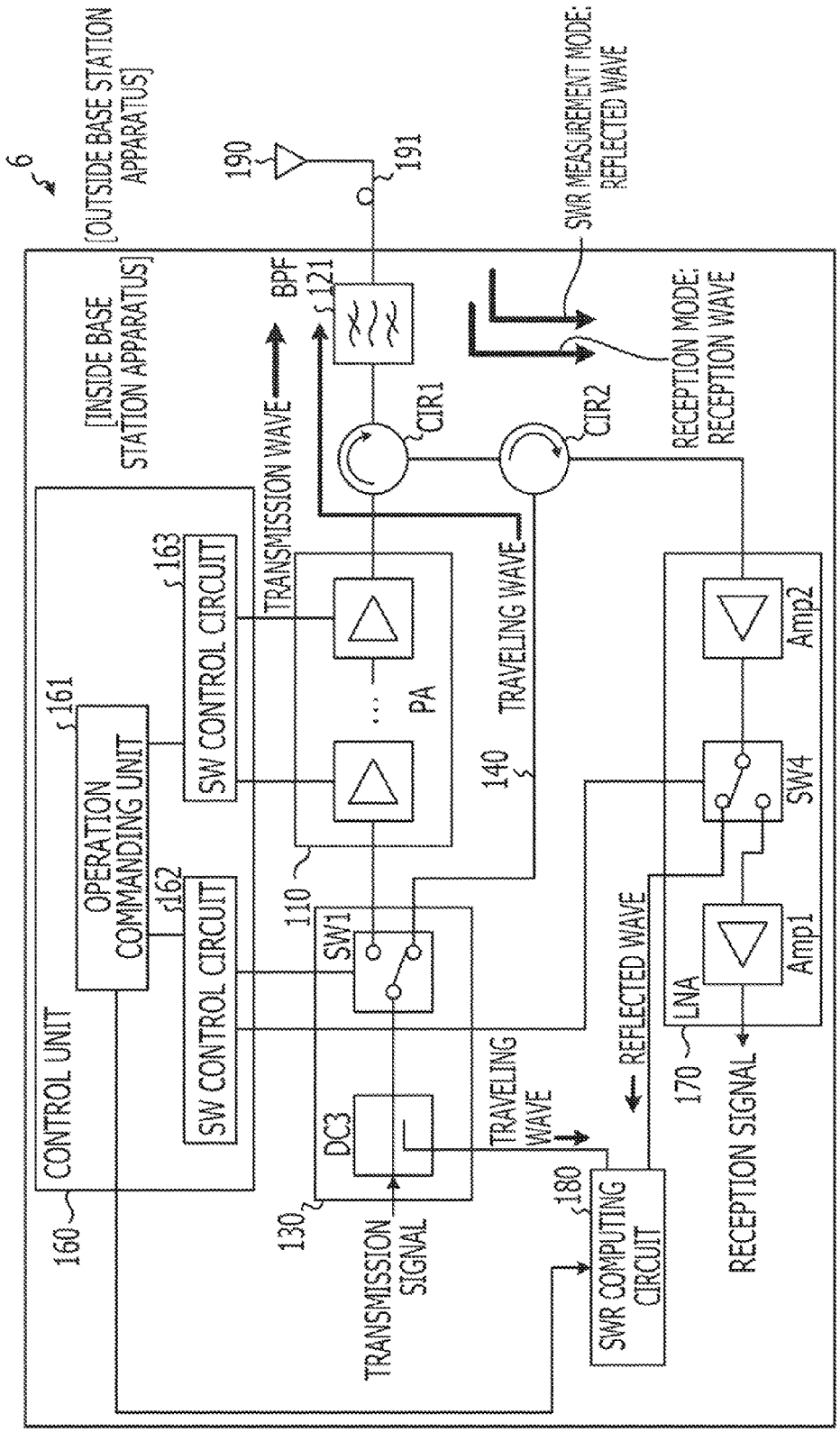
FIG. 9 is a functional block diagram illustrating the configuration of a standing wave ratio measuring circuit according to a sixth embodiment.

First, the configuration of the standing wave ratio measuring circuit 6 according to the sixth embodiment will be described. FIG. 9 is a functional block diagram illustrating the configuration of the standing wave ratio measuring circuit 6 according to the sixth embodiment. Components that are the same as the components of the standing wave ratio measuring circuit 2 illustrated in FIG. 2 are denoted by the same reference symbols to omit redundant description of the components and their operations. The sixth embodiment is different from the second embodiment in that the DC4 included in the LNA 170 has been replaced with the SW4.

In the standing wave ratio measuring circuit 6, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, and the LNA 170 are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 and the SW4 included in the reflected wave acquiring unit 170 are each connected to the measuring circuit 180.

The SW4 is an SPDT switch, and is interposed between two of the plurality of amplifiers to switch the travel destination of the reflected wave between the Amp1 which follows the SW4 and the SWR computing circuit 180. The SW4 is preferably an inexpensive reflective SPDT switch with no anti-reflection terminator provided inside. However, the SW4 may be an expensive non-reflective SPDT switch with an anti-reflection terminator with an impedance of 50 ohms (Ω), for example.

Next, the content of control performed on various units in each operation mode will be described with reference to FIG. 10. FIG. 10 illustrates the content of control performed on various units in each operation mode. As illustrated in FIG. 10, the various units are controlled depending on whether the operation mode is the transmission mode, the reception mode, or the SWR measurement mode.

When a transmission interval in which the operation mode is a transmission mode 6a is entered, a transmission wave (transmission signal) is propagated in the direction of the transmission/reception antenna 190, which turns "ON" the output of the transmission signal. At this time, the operation commanding unit 161 provides the SW control circuit 162 and the PA control circuit 163 with a request to transmit a transmission signal. Then, the SW control circuit 162 commands the SW1 to switch the connection destination to the PA 110 side, which causes the SW1 to be "connected to the PA 110 side". The SW control circuit 162 also commands the SW4 to switch the connection destination to the SWR computing circuit 180 side, which causes the SW4 to be "connected to the SWR computing circuit 180 side". Meanwhile, the PA control circuit 163 controls the operating-point voltage of the PA 110 to the class-A operating-point voltage, which turns "ON" the operation of the PA 110. In addition, the operation commanding unit 161 commands the SWR computing circuit 180 to be disabled. The operation of the SWR computing circuit 180 is turned "OFF".

Consequently, when a transmission interval is entered, a transmission wave (transmission signal) travels from the SW1 to the PA 110 to be amplified by the PA 110, and is output to the transmission/reception antenna 190 by way of the CIR1.

When a reception interval in which the operation mode is a reception mode 6b is entered, a reception wave received by the transmission/reception antenna 190 is propagated in the direction of the reception system, which turns "OFF" the output of the transmission signal. At this time, the operation commanding unit 161 provides the SW control circuit 162 and the PA control circuit 163 with a request to receive a reception signal. Then, the SW control circuit 162 commands the SW1 to switch the connection destination to the CIR2 side, which causes the SW1 to be "connected to the CIR2 side". The SW control circuit 162 also commands the SW4 to switch the connection destination to the LNA 170 (Amp1) side, which causes the SW4 to be "connected to the LNA 170 side". Meanwhile, the PA control circuit 163 performs control so as to turn off the operation of the PA 110. The operation of the PA 110 is turned "OFF". For example, the PA control circuit 163 performs control so as to set the operating-point voltage of the PA 110 to the pinch-off voltage. Furthermore, the operation commanding unit 161 commands the SWR computing circuit 180 to be disabled. The operation of the SWR computing circuit 180 is turned "OFF".

Consequently, when a reception interval is entered, a reception wave is output from the transmission/reception antenna 190 to a reception circuit (not illustrated), which processes a reception signal, by way of the CIR1 and the CIR2 via the SW4.

When a guard-time interval in which the operation mode is an SWR measurement mode 6c is entered, a traveling wave is propagated in the direction of the transmission/reception antenna 190, which turns "ON" the output of the transmission signal (traveling wave). At this time, the operation commanding unit 161 provides the SW control circuit 162 and the PA control circuit 163 with a request to measure the standing wave ratio. Then, the SW control circuit 162 commands the SW1 to switch the connection destination to the CIR2 side, which causes the SW1 to be "connected to the CIR2 side". The SW control circuit 162 also commands the SW4 to switch the connection destination to the SWR computing circuit 180 side, which causes the SW4 to be "connected to the SWR computing circuit 180 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Furthermore, the operation commanding unit 161 commands the SWR computing circuit 180 to be enabled. The operation of the SWR computing circuit 180 is turned "ON".

Consequently, when a guard-time interval is entered, a traveling wave is output to the SWR computing circuit 180 via the DC3, and also travels from the SW1 to the CIR2 to travel in the direction of the PA 110 by way of the CIR2 and the CIR1. Then, the traveling wave is almost totally reflected by the PA 110, and output to the transmission/reception antenna 190 by way of the CIR1. Further, the reflected wave, which is the traveling wave reflected in the vicinity of the transmission/reception antenna 190, is output to the SWR computing circuit 180 by way of the CIR1 and the CIR2 via the SW4. As a result, the SWR computing circuit 180 measures the standing wave ratio using the traveling wave and the reflected wave.

According to the standing wave ratio measuring circuit 6 of the sixth embodiment, the LNA 170 includes a plurality of amplifiers for amplifying the reflected wave, and the SW4 interposed between two of the plurality of amplifiers, namely Amp1 and Amp2. The SW4 allows the reflected wave to travel to the SWR computing circuit 180 when a guard-time interval is entered, using a path capable of switching the travel destination of the reflected wave between the Amp1, which follows the SW4 and the SWR computing circuit 180. Consequently, in the standing wave ratio measuring circuit 6, the entire reflected wave is caused to travel to the SWR computing circuit 180 when a guard-time interval is entered, and thus the signal level of the reflected wave can be increased to precisely measure the SWR.

[Seventh Embodiment]

In the standing wave ratio measuring circuit 2 according to the second embodiment, the traveling wave is a high-frequency (RF) signal. That is, when the traveling wave is at an RF frequency, the reflected wave reflected in the vicinity of the transmission/reception antenna 190 is also at an RF frequency. However, a standing wave ratio measuring circuit 7 is not limited to such a configuration, and a reflected wave at an Intermediate Frequency (IF) obtained by converting a reflected wave at an RF frequency may be distributed by a DC4b. Thus, in a standing wave ratio measuring circuit 7 according to a seventh embodiment, the DC4b distributes an IF reflected wave obtained by converting an RF reflected wave to the SWR computing circuit 180.

Figure 11:
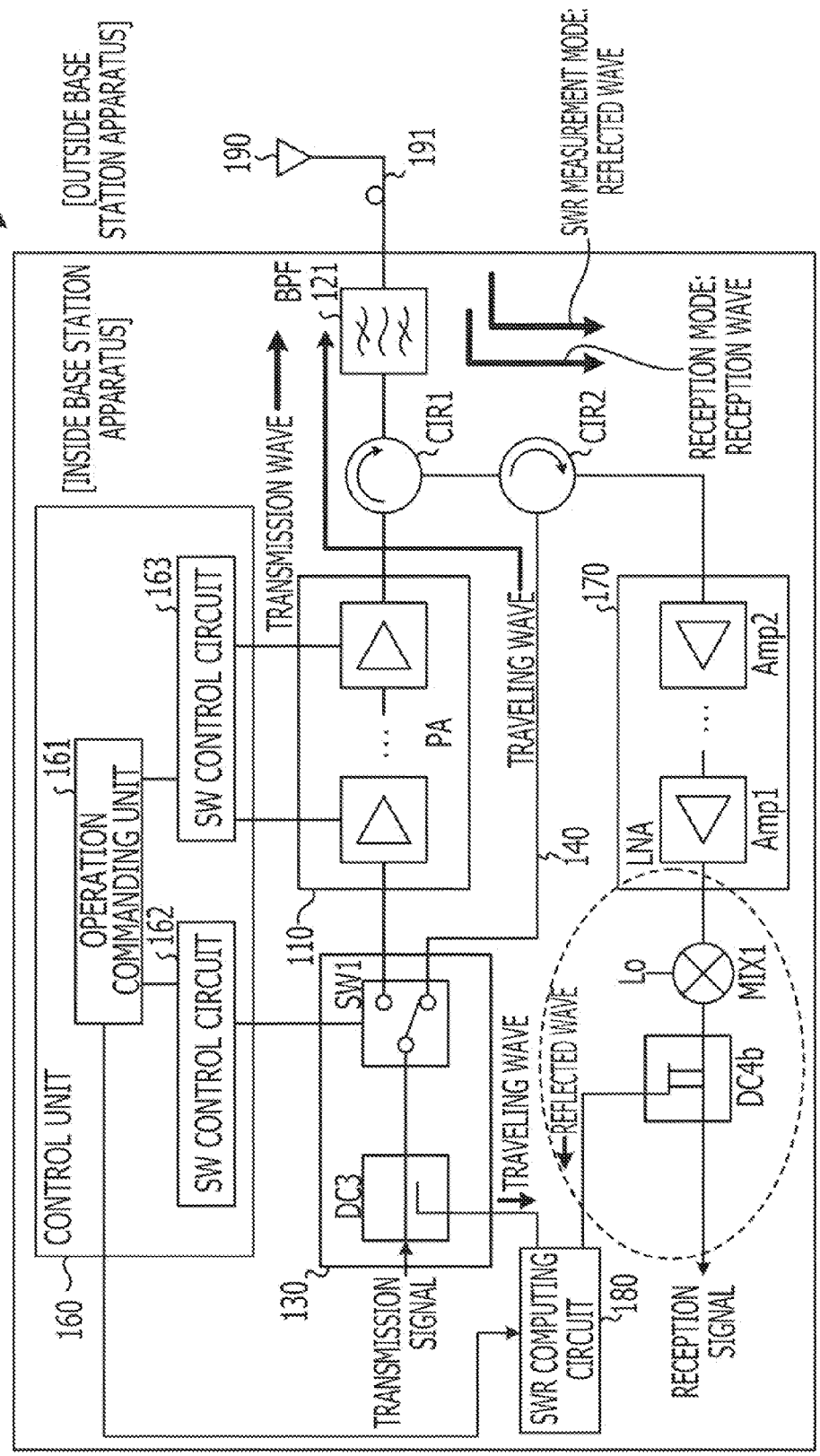
FIG. 11 is a functional block diagram illustrating the configuration of a standing wave ratio measuring circuit according to a seventh embodiment.

First, the configuration of the standing wave ratio measuring circuit 7 according to the seventh embodiment will be described. FIG. 11 is a functional block diagram illustrating the configuration of the standing wave ratio measuring circuit 7 according to the seventh embodiment. Components that are the same as the components of the standing wave ratio measuring circuit 2 illustrated in FIG. 2 are denoted by the same reference symbols to omit redundant description of the components and their operations. The seventh embodiment is different from the second embodiment in that the location of a coupler (DC4b) that allows the reflected wave to travel to the SWR computing circuit 180 has been changed from the inside of the LNA 170 to the outside of the LNA 170, and that a frequency converter (MIX1) has been added.

In the standing wave ratio measuring circuit 7, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, the LNA 170, the MIX1, and the DC4b are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 and the DC4b included in the reception system are each connected to the SWR computing circuit 180.

The MIX1 is a frequency converter that converts the frequency of a signal. The MIX1 converts the frequency of a reception signal amplified by the LNA 170 from an RF frequency into an IF frequency. The IF frequency is a frequency of several hundred megahertz (MHz) or less, for example.

The DC4b is a directional coupler, a kind of coupler that couples and distributes a reception signal. The DC4b extracts a reception signal as a reflected wave to distribute the extracted reflected wave. Specifically, the DC4b extracts a reception signal converted into an IF frequency by the MIX1 as a reflected wave to distribute the extracted reflected wave to the SWR computing circuit 180 and a reception circuit (not illustrated) that performs a process for the reception system.

The content of control performed on various units of the standing wave ratio measuring circuit 7 in each operation mode according to the seventh embodiment is the same as the corresponding operation performed in the second embodiment (FIG. 4), and thus is not described.

According to the seventh embodiment, the standing wave ratio measuring circuit 7 includes the LNA 170 which amplifies a reflected wave, the MIX1 which converts the frequency of the reflected wave amplified by the LNA 170 into an IF frequency, and the DC4b which distributes the reflected wave, the frequency of which has been converted by the MIX1, to the SWR computing circuit 180. Consequently, in the standing wave ratio measuring circuit 7, the frequency of the reception signal is converted from an RF frequency into an IF frequency, and thus the load imposed on a circuit that processes the signal after the conversion, such as the SWR computing circuit 180, is reduced.

[Eighth Embodiment]

In the standing wave ratio measuring circuit 2 according to the second embodiment, the traveling wave is a high-frequency (RF) signal. That is, when the traveling wave is at an RF frequency, the reflected wave reflected in the vicinity of the transmission/reception antenna 190 is also at an RF frequency. However, a standing wave ratio measuring circuit 8 is not limited to such a configuration, and a reflected wave at an IF frequency obtained by converting a reflected wave at an RF frequency may be allowed to travel to the SWR computing circuit 180 by an SW5. Thus, in a standing wave ratio measuring circuit 8 according to an eighth embodiment, the SW5 allows an IF reflected wave obtained by converting an RF reflected wave to pass to the SWR computing circuit 180.

Figure 12:
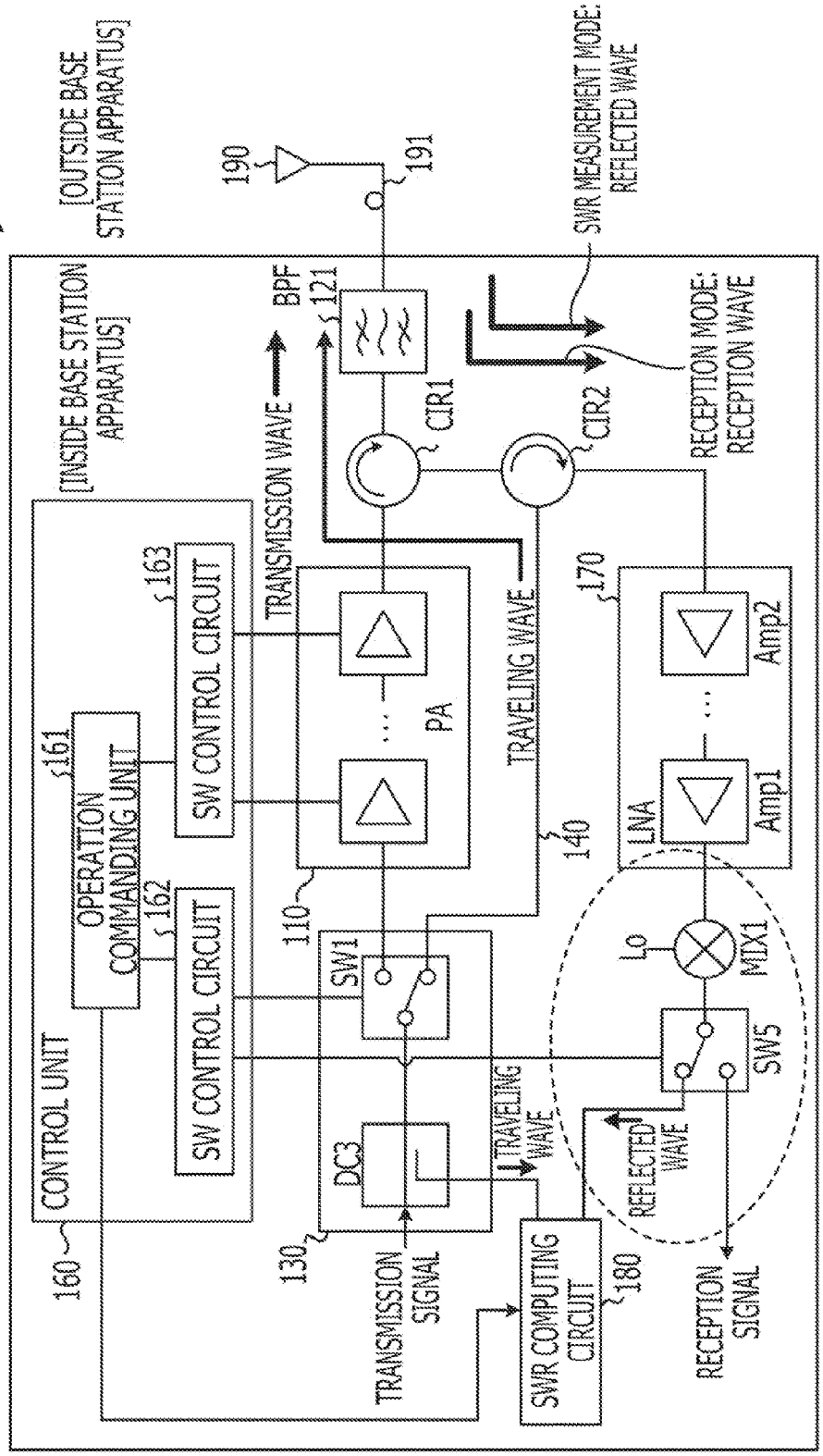
FIG. 12 is a functional block diagram illustrating the configuration of a standing wave ratio measuring circuit according to an eighth embodiment.

First, the configuration of the standing wave ratio measuring circuit 8 according to the eighth embodiment will be described. FIG. 12 is a functional block diagram illustrating the configuration of the standing wave ratio measuring circuit 8 according to the eighth embodiment. Components that are the same as the components of the standing wave ratio measuring circuit 2 illustrated in FIG. 2 are denoted by the same reference symbols to omit redundant description of the components and their operations. The eighth embodiment is different from the second embodiment in that the location of a component that allows the reflected wave to travel to the SWR computing circuit 180 has been changed from the inside of the LNA 170 to the outside of the LNA 170 and that a frequency converter (MIX1) has been added.

In the standing wave ratio measuring circuit 8, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, the LNA 170, the MIX1, and the SW5 are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 and the SW5 included in the reception system are each connected to the SWR computing circuit 180.

The MIX1 is a frequency converter that converts the frequency of a signal. The MIX1 converts the frequency of a reception signal amplified by the LNA 170 from an RF frequency into an IF frequency. The IF frequency is a frequency of several hundred megahertz (MHz) or less, for example. The SW5 is a switch for an IF band, and switches the travel destination of the reflected wave between the SWR computing circuit 180 and a reception circuit (not illustrated).

Next, the content of control performed on various units in each operation mode will be described with reference to FIG. 13. FIG. 13 illustrates the content of control performed on various units in each operation mode. As illustrated in FIG. 13, the various units are controlled depending on whether the operation mode is the transmission mode, the reception mode, or the SWR measurement mode.

When a transmission interval in which the operation mode is a transmission mode 8a is entered, a transmission wave (transmission signal) is propagated in the direction of the transmission/reception antenna 190, which turns "ON" the output of the transmission signal. At this time, the operation commanding unit 161 provides the SW control circuit 162 and the PA control circuit 163 with a request to transmit a transmission signal. Then, the SW control circuit 162 commands the SW1 to switch the connection destination to the PA 110 side, which causes the SW1 to be "connected to the PA 110 side". The SW control circuit 162 also commands the SW5 to switch the connection destination to the SWR computing circuit 180 side, which causes the SW5 to be "connected to the SWR computing circuit 180 side". The PA control circuit 163 controls the operating-point voltage of the PA 110 to the class-A operating-point voltage, which turns "ON" the operation of the PA 110. Also, the operation commanding unit 161 commands the SWR computing circuit 180 to be disabled. The operation of the SWR computing circuit 180 is turned "OFF".

Consequently, when a transmission interval is entered, a transmission wave (transmission signal) travels from the SW1 to the PA 110 to be amplified by the PA 110, and is output to the transmission/reception antenna 190 by way of the CIR1.

When a reception interval in which the operation mode is a reception mode 8b is entered, a reception wave received by the transmission/reception antenna 190 is propagated in the direction of the reception system, which turns "OFF" the output of the transmission signal. At this time, the operation commanding unit 161 provides the SW control circuit 162 and the PA control circuit 163 with a request to receive a reception signal. Then, the SW control circuit 162 commands the SW1 to switch the connection destination to the CIR2 side, which causes the SW1 to be "connected to the CIR2 side". The SW control circuit 162 also commands the SW5 to switch the connection destination to the reception circuit (not illustrated) side, which causes the SW5 to be "connected to the reception circuit side". Also, the PA control circuit 163 performs control so as to turn off the operation of the PA 110, which turns "OFF" the operation of the PA 110. For example, the PA control circuit 163 performs control so as to set the operating-point voltage of the PA 110 to the pinch-off voltage. Furthermore, the operation commanding unit 161 commands the SWR computing circuit 180 to be disabled, which turns "OFF" the operation of the SWR computing circuit 180.

Consequently, when a reception interval is entered, a reception wave is output from the transmission/reception antenna 190 to a reception circuit (not illustrated) by way of the CIR1 and the CIR2 via the SW5.

When a guard-time interval in which the operation mode is an SWR measurement mode 8c is entered, a traveling wave is propagated in the direction of the transmission/reception antenna 190, which turns "ON" the output of the transmission signal (traveling wave). At this time, the operation commanding unit 161 provides the SW control circuit 162 and the PA control circuit 163 with a request to measure the standing wave ratio. Then, the SW control circuit 162 commands the SW1 to switch the connection destination to the CIR2 side, which causes the SW1 to be "connected to the CIR2 side". The SW control circuit 162 also commands the SW5 to switch the connection destination to the SWR computing circuit 180 side, which causes the SW5 to be "connected to the SWR computing circuit 180 side". Meanwhile, the PA control circuit 163 performs control so as to turn off the operation of the PA 110, which turns the operation of the PA 110 to "OFF". For example, the PA control circuit 163 performs control so as to set the operating-point voltage of the PA 110 to the pinch-off voltage. Furthermore, the operation commanding unit 161 commands the SWR computing circuit 180 to be enabled. The operation of the SWR computing circuit 180 is turned "ON".

Consequently, when a guard-time interval is entered, a traveling wave is output to the SWR computing circuit 180 via the DC3, and also travels from the SW1 to the CIR2 to travel in the direction of the PA 110 by way of the CIR2 and the CIR1. Then, the traveling wave is almost totally reflected by the PA 110, and output to the transmission/reception antenna 190 by way of the CIR1. Additionally, the reflected wave, which is the traveling wave reflected in the vicinity of the transmission/reception antenna 190, is output to the SWR computing circuit 180 by way of the CIR1 and the CIR2 via the SW5. As a result, the SWR computing circuit 180 measures the standing wave ratio using the traveling wave and the reflected wave.

According to the eighth embodiment, the standing wave ratio measuring circuit 8 includes the LNA 170 which amplifies a reflected signal, the MIX1 which converts the frequency of the reception signal amplified by the LNA 170 into an IF frequency, and the SW5. The SW5 allows the reception signal to travel to the SWR computing circuit 180 as a reflected wave when a guard-time interval is entered, using a path capable of switching the travel destination of the reception signal, the frequency of which has been converted by the MIX1, between the reception circuit which follows the SW5 and the SWR computing circuit 180. Consequently, in the standing wave ratio measuring circuit 8, all the reflected wave is caused to travel to the SWR computing circuit 180 when a guard-time interval is entered, and thus the signal level of the reflected wave can be increased to precisely measure the SWR. In addition, in the standing wave ratio measuring circuit 8, the frequency of the reception signal is converted from an RF frequency into an IF frequency, and thus the load imposed on a circuit that processes the signal after the conversion, such as the SWR computing circuit 180, is reduced.

[Ninth Embodiment]

In the standing wave ratio measuring circuit 2 according to the second embodiment, the standing wave ratio is measured using the SWR computing circuit 180. However, a standing wave ratio measuring circuit 9 is not limited to such a configuration, and the standing wave ratio may be measured using a signal processing circuit 200 including an SWR computing circuit and a reception circuit. Thus, in a standing wave ratio measuring circuit 9 according to a ninth embodiment, the standing wave ratio is measured using the signal processing circuit 200 including an SWR computing circuit and a reception circuit.

Figure 14:
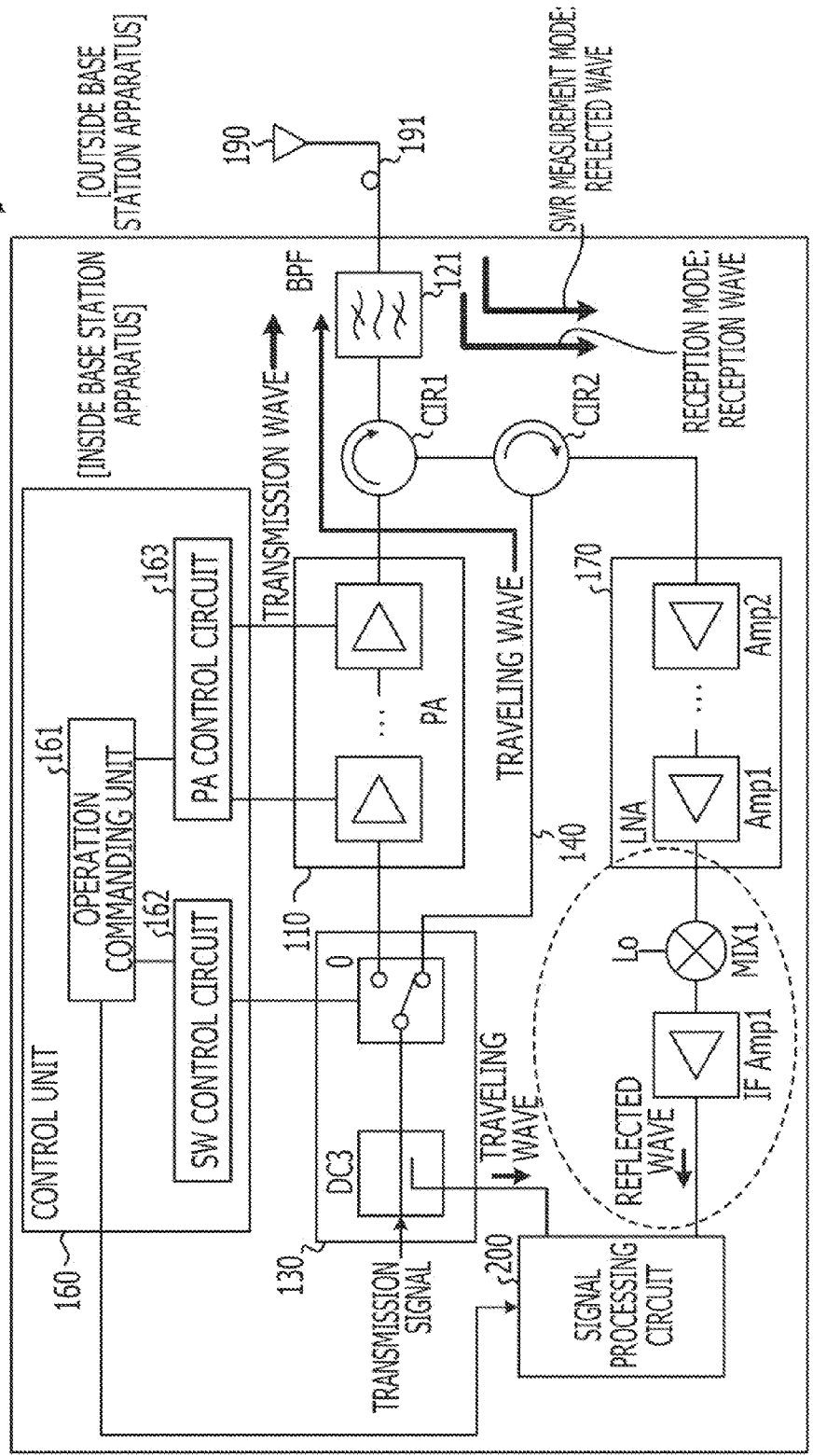
FIG. 14 is a functional block diagram illustrating the configuration of a standing wave ratio measuring circuit according to a ninth embodiment.
Figure 15:
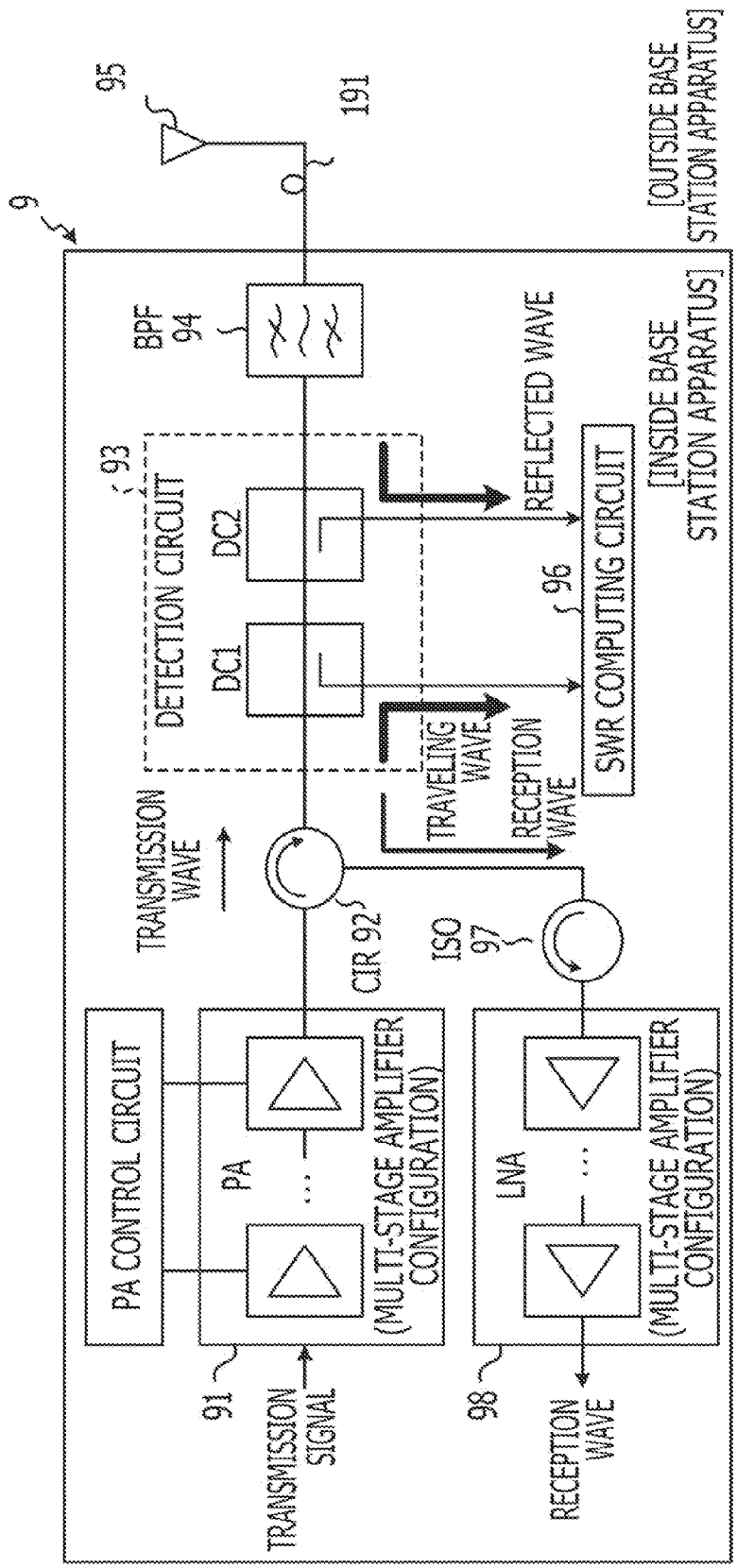
FIG. 15 illustrates a standing wave ratio measuring circuit according to the related art.
Figure 16:
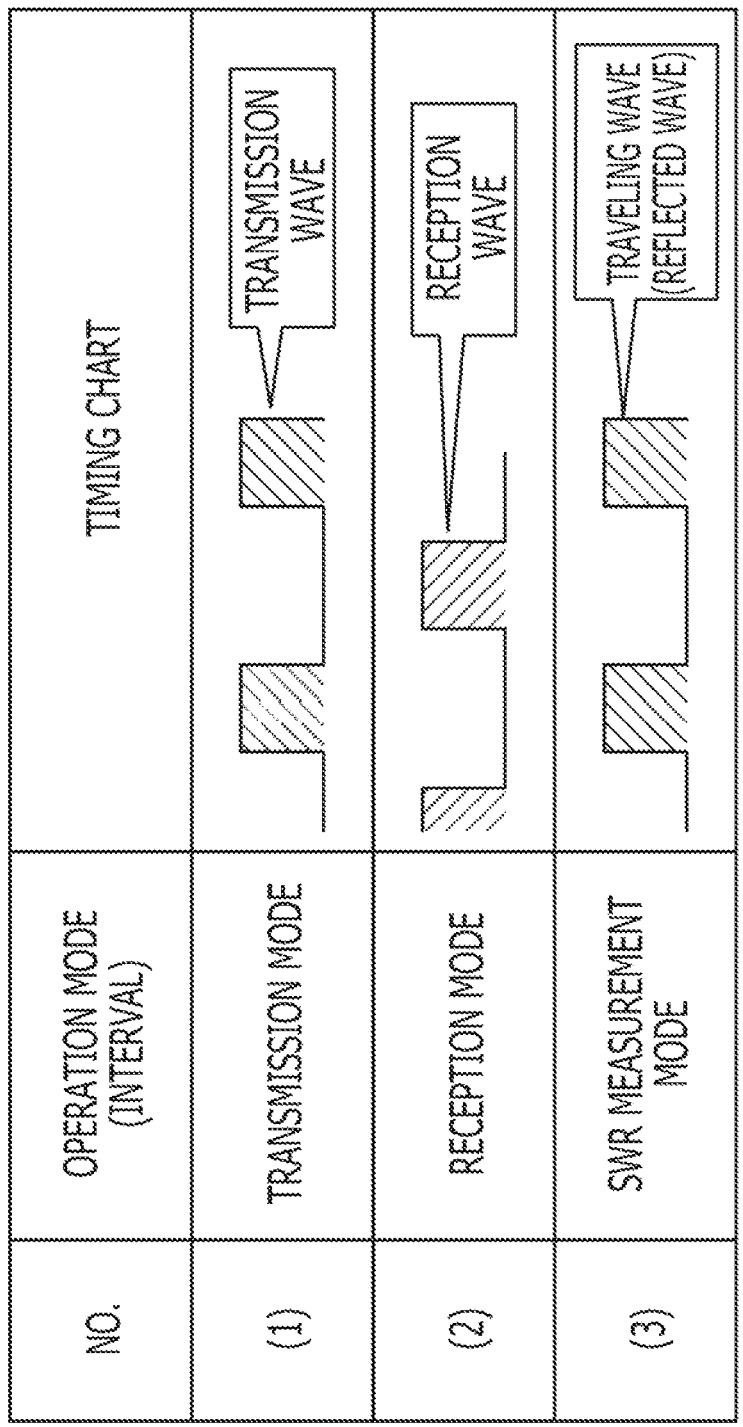
FIG. 16 illustrates the standing wave ratio measuring circuit according to the related art.

First, the configuration of the standing wave ratio measuring circuit 9 according to the ninth embodiment will be described. FIG. 14 is a functional block diagram illustrating the configuration of the standing wave ratio measuring circuit 9 according to the ninth embodiment. Components that are the same as the components of the standing wave ratio measuring circuit 2 illustrated in FIG. 2 are denoted by the same reference symbols to omit redundant description of the components and their operations. The ninth embodiment is different from the second embodiment in that the SWR computing circuit 180 has been replaced with the signal processing circuit 200, that the DC4 has been removed, and that a MIX1 and an IFAmp1 have been added.

In the standing wave ratio measuring circuit 9, the traveling wave acquiring unit 130, the amplifier circuit 110, the CIR1, the BPF 121, the cable 191, and the transmission/reception antenna 190 are connected in series to serve as a transmission system. Meanwhile, the CIR1, the CIR2, the LNA 170, the MIX1, and the IMAmp1 are connected in series to serve as a reception system. The SW1 included in the traveling wave acquiring unit 130 and the CIR2 included in the reception system are connected through the traveling wave bypassing unit 140. The DC3 included in the traveling wave acquiring unit 130 and the IFAmp1 included in the reception system are each connected to the signal processing circuit 200.

The MIX1 is a frequency converter that converts the frequency of a signal. The MIX1 converts the frequency of a reception signal amplified by the LNA 170 from an RF frequency into an IF frequency. The IF frequency is a frequency of several hundred megahertz or less, for example.

The IFAmp1 is an amplifier for an IF frequency. The IFAmp1 amplifies a reception signal converted from an RF frequency into an IF frequency by the MIX1 to output the amplified reception signal to the signal processing circuit 200 as a reflected wave.

The DC3 is a directional coupler, a kind of coupler that couples and distributes a transmission signal. When a request to measure the standing wave ratio is detected, the DC3 extracts a transmission signal before being input to the PA 110 as a traveling wave to distribute the extracted traveling wave. Specifically, when a request to measure the standing wave ratio is detected, the DC3 extracts a transmission signal as a traveling wave to distribute the extracted traveling wave to the SW1 and the signal processing circuit 200.

The signal processing circuit 200 measures the standing wave ratio using the traveling wave acquired by the DC3 and the reflected wave acquired by the IFAmp1. Specifically, the signal processing circuit 200 adjusts the voltage of the reception signal, which has been amplified by the LNA 170 and the IFAmp1, to the voltage before being amplified to measure the standing wave ratio using the reception signal (reflected wave) with the adjusted voltage and the traveling wave.

The content of control performed on various units of the standing wave ratio measuring circuit 9 in each operation mode according to the ninth embodiment is the same as the corresponding operation performed in the second embodiment (FIG. 4), and thus is not described.

According to the ninth embodiment, the standing wave ratio measuring circuit 9 includes the LNA 170 which amplifies a reflected signal, the MIX1 which converts the frequency of the reception signal amplified by the LNA 170 into an IF frequency, and the IFAmp1. The IFAmp1 amplifies a reflected wave, the frequency of which has been converted by the MIX1, to output the amplified reflected wave to the signal processing circuit 200 including an SWR computing circuit and a reception circuit. Consequently, in the standing wave ratio measuring circuit 9, the process for a reflected wave is performed by the signal processing circuit 200, which makes it possible to reduce a component for acquiring a reflected wave such as a coupler or a switch. As a result, in the standing wave ratio measuring circuit 9, no pass loss is caused by a component for acquiring a reflected wave, and thus the pass loss caused by the entire reception system can be reduced.

In the standing wave ratio measuring circuits 1 to 9 according to the first to ninth embodiments, the traveling wave acquiring unit 130 may acquire a non-modulated wave as a traveling wave. Consequently, the traveling wave acquiring unit 130 can acquire a stable signal with little variation in signal level, which allows the standing wave ratio measuring circuits 1 to 9 to measure the standing wave ratio with precision using the acquired signal.

Moreover, according to the standing wave ratio measuring circuits 2 to 9 of the second to ninth embodiments, when a request to measure the standing wave ratio is detected, the PA control circuit 163 controls the voltage of the PA 110 such that the traveling wave output from the CIR2 travels in the direction of the transmission/reception antenna 190 via the CIR1. In this case, when a request to measure the standing wave ratio is detected, the PA control circuit 163 performs control so as to set the operating-point voltage of the PA 110 to the pinch-off voltage by setting the drain-source voltage to a constant value, as an example. However, the present invention is not limited thereto, and the PA control circuit 163 may perform control so as to set the operating-point voltage of the PA 110 to the pinch-off voltage by setting the drain-source voltage to "0". Alternatively, the PA control circuit 163 may turn off the PA 110 when a request to measure the standing wave ratio is detected.

It is not necessary that the constituent elements of the devices illustrated in the first to ninth embodiments should be physically configured as illustrated. The specific form of distribution and integration of the devices is not limited to the illustrated form, and all or some of the devices may be functionally or physically distributed and integrated in desired units in accordance with various types of loads, the status of use, and so forth. For example, the PA 110 with a multi-stage amplifier configuration for amplifying a transmission signal may be distributed to a plurality of amplifier circuits with a single-stage amplifier configuration. The SWR computing circuit 180 may be connected to any of the standing wave ratio measuring circuits 2 to 9 by way of a network as an external device. The control unit 160 and the SWR computing circuit 180 may be respectively included in separate devices and coupled through a network for cooperation to realize the function of the standing wave ratio measuring circuits 2 to 9.

All or some of the processes performed automatically in the embodiments may be performed manually. For example, the process performed by the operation commanding unit 161 in FIG. 2 may be performed manually.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A standing wave ratio measuring circuit comprising:
   an amplifier circuit which amplifies a transmission signal;
   a first circulator which outputs the transmission signal amplified by the amplifier circuit in a direction of a transmission/reception antenna, and that outputs a reception signal received by the transmission/reception antenna to a reception system;
   a traveling wave acquiring unit which acquires the transmission signal before being input to the amplifier circuit as a traveling wave when a request to measure a standing wave ratio is detected;
   a traveling wave bypassing unit which allows the traveling wave acquired by the traveling wave acquiring unit to travel to the reception system while bypassing the amplifier circuit;
   a second circulator provided in the reception system which outputs the traveling wave bypassing the amplifier circuit through the traveling wave bypassing unit in a direction of the first circulator;
   a control unit which controls the amplifier circuit such that the traveling wave output from the second circulator travels in the direction of the transmission/reception antenna via the first circulator;
   a reflected wave acquiring unit which acquires a reflected wave, which is the traveling wave reflected in the vicinity of the transmission/reception antenna, at a location after the second circulator in the reception system; and
   a measuring circuit which measures the standing wave ratio using the traveling wave acquired by the traveling wave acquiring unit and the reflected wave acquired by the reflected wave acquiring unit.

2. The standing wave ratio measuring circuit according to claim 1,
   wherein the control unit performs control so as to set an operating-point voltage of the amplifier circuit to a pinch-off voltage.

3. The standing wave ratio measuring circuit according to claim 1,
   the traveling wave acquiring unit further comprising:
   a transmission-system directional coupler which extracts the transmission signal as a traveling wave to distribute the extracted traveling wave; and
   a transmission-system switch which allows the traveling wave to travel to the traveling wave bypassing unit using a path capable of switching a travel destination of the traveling wave between the amplifier circuit and the traveling wave bypassing unit.

4. The standing wave ratio measuring circuit according to claim 1,
   the traveling wave acquiring unit further comprising:
   a transmission-system switch which allows the transmission signal to travel to the traveling wave bypassing unit using a path that is capable of switching a travel destination of the transmission signal between the amplifier circuit and the traveling wave bypassing unit; and
   a transmission-system directional coupler provided in the traveling wave bypassing unit which extracts the transmission signal as a traveling wave and distributes the extracted traveling wave.

5. The standing wave ratio measuring circuit according to claim 3,
   the traveling wave bypassing unit further comprising:
   a reflective switch provided in the vicinity of the second circulator to allow the reflected wave to travel to a terminator that terminates with a predetermined impedance using a path capable of switching a travel destination of a reflected wave, which is the reception signal reflected by the reflected wave acquiring unit, between the transmission-system switch and the terminator.

6. The standing wave ratio measuring circuit according to claim 1,
the reflected wave acquiring unit further comprising:
a plurality of reception-system amplifier circuits which amplify the reflected wave; and
a reception-system directional coupler interposed between two of the plurality of reception-system amplifier circuits which distributes the reflected wave.

7. The standing wave ratio measuring circuit according to claim 1,
the reflected wave acquiring unit further comprising:
a plurality of reception-system amplifier circuits which amplify the reflected wave; and
a reception-system switch interposed between two of the plurality of reception-system amplifier circuits which allows the reflected wave to travel to the measuring circuit using a path capable of switching a travel destination of the reflected wave between the reception-system amplifier circuit which follows the reception-system switch and the measuring circuit.

8. The standing wave ratio measuring circuit according to claim 1,
the reflected wave acquiring unit further comprising:
a reception-system amplifier circuit which amplifies the reflected wave;
a frequency converter which converts a frequency of the reflected wave amplified by the reception-system amplifier circuit into an intermediate frequency; and
a reception-system directional coupler which distributes the reflected wave, the frequency of which has been converted by the frequency converter, to the measuring circuit.

9. The standing wave ratio measuring circuit according to claim 1,
the reflected wave acquiring unit further comprising:
a reception-system amplifier circuit which amplifies the reflected wave;
a frequency converter which converts a frequency of the reflected wave amplified by the reception-system amplifier circuit into an intermediate frequency; and
a reception-system switch which allows the reflected wave to travel to the measuring circuit using a path capable of switching a travel destination of the reflected wave, the frequency of which has been converted by the frequency converter, between a reception-system circuit which follows the reception-system switch and the measuring circuit.

10. The standing wave ratio measuring circuit according to claim 1,
the reflected wave acquiring unit further comprising:
a first reception-system amplifier circuit which amplifies the reflected wave;
a frequency converter which converts a frequency of the reflected wave amplified by the first reception-system amplifier circuit into an intermediate frequency; and
a second reception-system amplifier circuit which amplifies the reflected wave, the frequency of which has been converted by the frequency converter, to output the amplified reflected wave to a signal processing circuit including the measuring circuit and a reception-system circuit.

11. The standing wave ratio measuring circuit according to claim 1,
wherein the traveling wave acquiring unit acquires a non-modulated wave as a traveling wave.

12. The standing wave ratio measuring circuit according to claim 1,
wherein the traveling wave acquiring unit acquires the transmission signal as a traveling wave when a request to measure the standing wave ratio is detected during a period not overlapped by a transmission period and a reception period assigned in a time-sharing manner.

13. The standing wave ratio measuring circuit according to claim 1,
wherein the traveling wave acquiring unit acquires the transmission signal as a traveling wave when a request to measure the standing wave ratio is detected during a predetermined part of a reception period.

14. A communication apparatus comprising:
an amplifier circuit that amplifies a transmission signal;
a first circulator that outputs the transmission signal amplified by the amplifier circuit in a direction of a transmission/reception antenna, and that outputs a reception signal received by the transmission/reception antenna to a reception system;
a traveling wave acquiring unit that acquires the transmission signal before being input to the amplifier circuit as a traveling wave when a request to measure a standing wave ratio is detected;
a traveling wave bypassing unit that allows the traveling wave acquired by the traveling wave acquiring unit to travel to the reception system while bypassing the amplifier circuit;
a second circulator provided in the reception system to output the traveling wave bypassing the amplifier circuit through the traveling wave bypassing unit in a direction of the first circulator;
a control unit that controls the amplifier circuit such that the traveling wave output from the second circulator travels in the direction of the transmission/reception antenna via the first circulator;
a reflected wave acquiring unit that acquires a reflected wave, which is the traveling wave reflected in the vicinity of the transmission/reception antenna, at a location after the second circulator in the reception system; and
a measuring circuit that measures the standing wave ratio using the traveling wave acquired by the traveling wave acquiring unit and the reflected wave acquired by the reflected wave acquiring unit.

* * * * *